(12) United States Patent
Ahn et al.

(10) Patent No.: US 11,770,926 B2
(45) Date of Patent: Sep. 26, 2023

(54) SEMICONDUCTOR DEVICES INCLUDING AN EDGE INSULATING LAYER

(71) Applicant: SAMSUNG ELECTRONICS CO., LTD., Suwon-si (KR)

(72) Inventors: Junhyeok Ahn, Suwon-si (KR); Kiseok Lee, Hwaseong-si (KR); Huijung Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 17/530,818

(22) Filed: Nov. 19, 2021

(65) Prior Publication Data
US 2022/0336464 A1    Oct. 20, 2022

(30) Foreign Application Priority Data
Apr. 16, 2021  (KR) .......................... 10-2021-0049519

(51) Int. Cl.
*H10B 12/00* (2023.01)
(52) U.S. Cl.
CPC ......... *H10B 12/315* (2023.02); *H10B 12/053* (2023.02); *H10B 12/34* (2023.02); *H10B 12/482* (2023.02); *H10B 12/485* (2023.02)
(58) Field of Classification Search
CPC ..... H10B 12/315; H10B 12/34; H10B 12/485
USPC .......................................................... 257/907
See application file for complete search history.

(56) References Cited

U.S. PATENT DOCUMENTS

| 6,429,068 | B1 | 8/2002 | Divakaruni et al. |
| 7,605,037 | B2 * | 10/2009 | Weis ....................... G11C 11/24 438/270 |
| 7,858,490 | B2 | 12/2010 | Mitshuira et al. |
| 7,868,411 | B2 | 1/2011 | Kim et al. |
| 8,293,603 | B2 | 10/2012 | Cho et al. |
| 8,298,893 | B2 | 10/2012 | Kim |
| 2009/0032856 | A1 | 2/2009 | Chen et al. |
| 2013/0026562 | A1 | 1/2013 | Beigel et al. |

(Continued)

FOREIGN PATENT DOCUMENTS

| TW | 201407841 | 2/2014 |
| TW | 201517125 | 5/2015 |

(Continued)

OTHER PUBLICATIONS

Taiwan Office Action issued in corresponding application No. TW 110146722 dated Jan. 5, 2023.

*Primary Examiner* — Hoai V Pham
(74) *Attorney, Agent, or Firm* — F. Chau & Associates, LLC

(57) ABSTRACT

A semiconductor device includes: a substrate including a cell area and an interface area; a gate electrode disposed in the substrate within the cell area and extending in a first direction; a plurality of bit lines intersecting the gate electrode and extending in a second direction intersecting the first direction, wherein the plurality of bit lines includes a plurality of first bit lines and a plurality of second bit lines alternately disposed in the first direction; edge spacers disposed within the interface area and contacting the plurality of second bit lines; and edge insulating layers disposed between the edge spacers and contacting the plurality of first bit lines, wherein at least a portion of each of the edge insulating layers is disposed within the interface area.

20 Claims, 38 Drawing Sheets

(56) References Cited

U.S. PATENT DOCUMENTS

| | | |
|---|---|---|
| 2013/0328005 A1 | 12/2013 | Shin et al. |
| 2014/0131786 A1 | 5/2014 | Ryu et al. |
| 2015/0048434 A1 | 2/2015 | Rhie |
| 2015/0111381 A1 | 4/2015 | Kim et al. |
| 2017/0110474 A1 | 4/2017 | Lee et al. |
| 2018/0061995 A1 | 3/2018 | Kimura et al. |
| 2019/0067373 A1 | 2/2019 | Yang et al. |
| 2019/0148147 A1 | 5/2019 | Huang et al. |
| 2020/0152659 A1 | 5/2020 | Lee et al. |
| 2020/0194456 A1 | 6/2020 | Baek |

FOREIGN PATENT DOCUMENTS

| | | |
|---|---|---|
| TW | 201523882 | 6/2015 |
| TW | 201812940 | 4/2018 |
| TW | 201914069 | 4/2019 |
| TW | 201923838 | 6/2019 |

\* cited by examiner

SEMICONDUCTOR DEVICES INCLUDING AN EDGE INSULATING LAYER

CROSS-REFERENCE TO THE RELATED APPLICATION

This application claims priority under 35 U.S.C. § 119 to Korean Patent Application No. 10-2021-0049519, filed on Apr. 16, 2021, in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor device including an edge insulating layer.

DISCUSSION OF THE RELATED ART

In accordance with demand for high integration and miniaturization of a semiconductor device, scaling down of semiconductor devices are currently under development. Accordingly, a semiconductor memory device used in an electronic appliance also requires high integration and, as such, design rules for constituent elements of the semiconductor memory device are reduced. Technology for reducing the size of a semiconductor device without degrading reliability of the semiconductor device is currently under development.

SUMMARY

According to an exemplary embodiment of the present inventive concept, a semiconductor device includes: a substrate including a cell area and an interface area; a gate electrode disposed in the substrate within the cell area and extending in a first direction; a plurality of bit lines intersecting the gate electrode and extending in a second direction intersecting the first direction, wherein the plurality of bit lines includes a plurality of first bit lines and a plurality of second bit lines alternately disposed in the first direction; edge spacers disposed within the interface area and contacting the plurality of second bit lines; and edge insulating layers disposed between the edge spacers and contacting the plurality of first bit lines, wherein at least a portion of each of the edge insulating layers is disposed within the interface area.

According to an exemplary embodiment of the present inventive concept, a semiconductor device includes: a substrate including a cell area and an interface area; a gate electrode disposed in the substrate within the cell area and extending in a first direction; a plurality of bit lines intersecting the gate electrode and extending in a second direction intersecting the first direction; an interlayer insulating layer disposed on the substrate within the interface area; and an edge insulating layer contacting the plurality of bit lines and extending in the first direction, wherein at least a portion of the edge insulating layer is disposed within the interface area, wherein the edge insulating layer is disposed between the plurality of bit lines and the interlayer insulating layer.

According to an exemplary embodiment of the present inventive concept, a semiconductor device includes: a substrate including a cell area and an interface area, wherein the substrate includes active regions disposed within the cell area; a gate electrode intersecting the active regions and extending in a first direction; a plurality of bit lines intersecting the gate electrode and extending in a second direction intersecting the first direction, wherein the plurality of bit lines includes a plurality of first bit lines and a plurality of second bit lines alternately disposed in the first direction edge spacers disposed within the interface area and contacting the plurality of second bit lines; and edge insulating layers disposed between the edge spacers and contacting the plurality of first bit lines, wherein at least a portion of each of the edge insulating layers are disposed within the interface area; a plurality of buried contacts disposed between adjacent first bit lines of the plurality of first bit lines and adjacent second bit lines of the plurality of second bit lines; a plurality of landing pads disposed on the plurality of buried contacts and an insulating structure disposed between the landing pads; and a capacitor structure disposed on the plurality of landing pads and the insulating structure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF EXEMPLARY EMBODIMENTS

Figure 1:
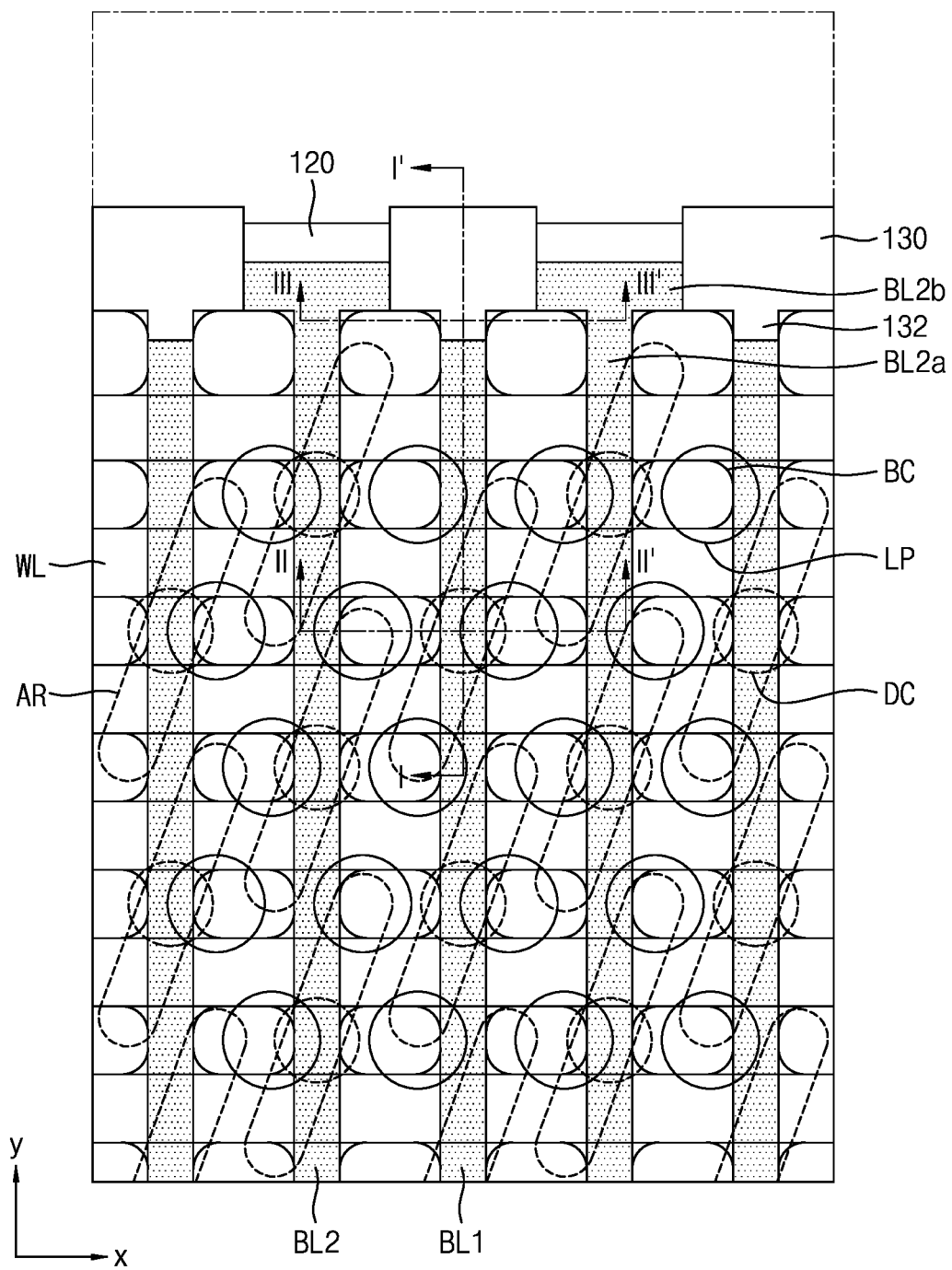
FIG. 1 is a plan view of a semiconductor device according to an exemplary embodiment of the present inventive concept.
Figure 2:
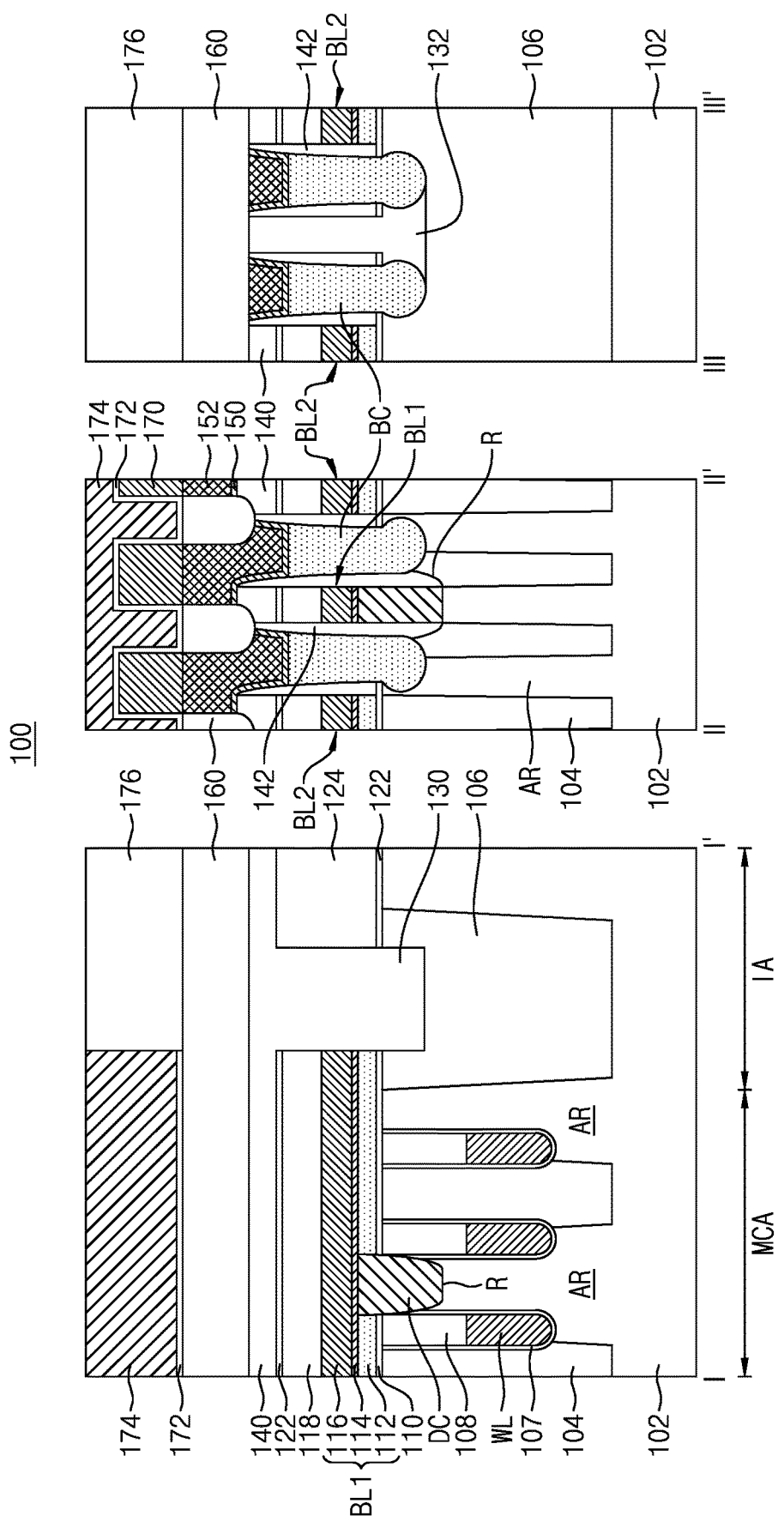
FIG. 2 are cross-sectional views of the semiconductor device taken along lines I-I', II-II' and III-III' in FIG. 1.

FIG. 1 is a plan view of a semiconductor device according to an exemplary embodiment of the present inventive concept. FIG. 2 are cross-sectional views of the semiconductor device taken along lines I-I', II-II' and III-III' in FIG. 1.

Referring to FIGS. 1 and 2, a semiconductor device 100 may include a substrate 102, a gate electrode WL, a first bit line BL1, a second bit line BL2, a first capping layer 118, an edge spacer 120, an edge insulating layer 130, a second capping layer 140, an insulating spacer 142, a buried contact BC, a landing pad 152, a lower electrode 170, a capacitor dielectric layer 172, and an upper electrode 174.

The substrate 102 may include a cell area MCA and an interface area IA. The cell area MCA may represent an area in which a memory cell of a DRAM device is disposed, and the interface area IA may be an area between the cell area MCA and a peripheral circuit area in which a row decoder, a sense amplifier, etc. are disposed. For example, the interface area IA may at least partially surround the cell area MCA. The substrate 102 may include a semiconductor material. For example, the substrate 102 may be a silicon substrate, a germanium substrate, a silicon germanium substrate, or a silicon-on-insulator (SOI) substrate.

The substrate 102 may include an active region AR, an element isolation layer 104, and an area separation layer 106. The element isolation layer 104 may be an insulating layer extending downwards from an upper surface of the substrate 102, and may define active regions AR in the cell area MCA. For example, the active regions AR may correspond to portions of the upper surface of the substrate 102 at least partially surrounded by the element isolation layer 104 in the cell area MCA, respectively. When, viewed in a plan view, the active regions AR may have a rectangular shape or a bar shape having a shorter axis and a longer axis, and may be spaced apart from one another. The area separation layer 106 may define the interface area IA. For example, when viewed in a cross-sectional view, an area in which the area separation layer 106 is disposed and an area facing the cell area MICA under the condition that the area separation layer 106 is interposed therebetween may be referred to as the interface area IA. The area separation layer 106 may be an insulating layer extending downwards from the upper surface of the substrate 102. The area separation layer 106 may electrically insulate the active region AR from a portion of the substrate 102 in the interface area IA.

When viewed in a plan view, gate electrodes WL may extend in an x direction while being spaced apart from one another in a y direction. In the specification, the x direction and the y direction may be referred to as a first horizontal direction and a second horizontal direction, respectively, and a direction perpendicularly intersecting the x direction and the y direction may be referred to as a vertical direction. In addition, the gate electrodes WL may intersect the active regions AR. For example, two gate electrodes WL may intersect one active region AR. When viewed in a cross-sectional view, the gate electrodes WL may be disposed in the substrate 102. For example, each gate electrode WL may be disposed within a trench formed in the substrate 102. The semiconductor device 100 may further include a gate dielectric layer 107 and a gate capping layer 108 which are disposed in the trench. The gate dielectric layer 107 may be conformally formed on an inner wall of the trench. The gate electrode WL may be disposed at a lower portion of the trench, and the gate capping layer 108 may be disposed on the gate electrode WL. The gate electrode WL may be disposed on the gate dielectric layer 107. For example, an upper surface of the gate capping layer 108 may be coplanar with upper surfaces of the element isolation layer 104 and the area separation layer 106. For example, an tipper surface of the gate capping layer 108 may be coplanar with an tipper surface of the gate dielectric layer 107.

The semiconductor device 100 may further include a buffer layer 110 covering the upper surfaces of the element isolation layer 104, the area separation, layer 106 and the gate capping layer 108. The buffer layer 110 may include, for example, silicon nitride.

When viewed in a plan view, first bit lines BL1 and second bit lines BL2 extend in the y direction while being spaced apart from one another in the x-direction. For example, the first bit lines BL1 and the second bit lines BL2 may be alternately disposed in the x direction. Each first bit line BL1 may have rectangular shape or a bar shape extending in the y direction. Each second bit line BL2 may have a T shape. For example, each second bit line BL2 may include a rectangular shaped or a bar-shaped tail portion BL2*a* extending in the y direction, and a head portion BL2*b* connected to an end of the tail portion BL2*a* in the y-direction while extending in the x direction. For example, the head portion BL2*b* may have a rectangular shape. The y-directional length of the tail portion BL2*a* may be greater than the y-directional length of each first bit line BL1.

When viewed in a cross-sectional view, the first bit line BL1 and the second bit line BL2 may include a first conductive layer 112, a second conductive layer 114 and a third conductive layer 116 which are sequentially stacked on the buffer layer 110. The first conductive layer 112 may include, for example, polysilicon, and each of the second conductive layer 114 and the third conductive layer 116 may include, for example, TiN, TiSiN, W, tungsten silicide, or a combination thereof.

The semiconductor device 100 may further include a direct contact DC contacting the active region AR while extending through the buffer layer 110 and the first conductive layer 112. For example, the direct contact DC may fill a recess R formed at the upper surface of the substrate 102. When viewed in a plan view, the direct contact DC may be disposed at a central portion of the active region AR. An tipper surface of the direct contact DC may be coplanar with an upper surface of the first conductive layer 112. The direct contact DC may electrically connect the active region AR to the bit lines BL1 and BL2. The direct contact DC may include, for example, polysilicon.

The first capping layer 118 may be disposed on the first bit lines BL1 and the second bit lines BL2. For example, the first capping layer 118 may contact the third conductive layer 116. The first capping layer 118 may extend in the y direction. The first capping layer 118 may include, for example, silicon nitride. When viewed in a cross-sectional view, the first conductive layer 112, the second conductive layer 114, the third conductive layer 116 and the first capping layer 118 may have substantially the same width as each other; however, the present inventive concept is not limited thereto. As another example, each of the first conductive layer 112, the second conductive layer 114, the third conductive layer 116 and the first capping layer 118 may have a substantially constant width.

When viewed in a plan view, the edge spacer 120 may contact the y-directional end of the second bit line BL2 while extending in the x direction. For example, the edge spacer 120 may contact the head portion BL2*b* of the second bit line BL2' Edge spacers 120 may be spaced apart from one another in the x direction. For example, the edge spacers 120 may be disposed in the interface area IA. The edge spacer 120 may include, for example, silicon oxide.

The semiconductor device 100 may further include an insulating liner 122 and an interlayer insulating layer 124. In the cell area MCA, the insulating liner 122 may cover the first capping layer 118. In the interface area IA, the insulating liner 122 may cover the tipper surfaces of the substrate 102 and the area separation layer 106. In addition, the insulating liner 122 may cover the edge spacer 120. The interlayer insulating layer 124 may be disposed on the insulating liner 122 in the interface area IA. The insulating liner 122 may include, for example, silicon nitride. The interlayer insulating layer 124 may include, for example, silicon oxide, silicon nitride, silicon oxynitride, or a combination thereof.

The edge insulating layer 130 may be disposed among the edge spacers 120 while contacting the first bit line BL1. For example, the edge insulating layer 130 may be disposed between the edge spacers. For example, the edge insulating layer 130 may include a protrusion 132 protruding in the y direction toward the first bit line BL1, and the protrusion 132 may contact an end surface of the first bit line BL1 in the y-direction. The protrusion 132 may be aligned with the first bit line BL1 in the y direction. For example, the protrusion 132 may overlap with the first bit line BL1 in the y direction, and the x-directional width of the protrusion 132 may be substantially equal to the x-directional width of the first bit line BL1. In addition, edge insulating layers 130 may be disposed to alternate with the second bit lines BL2 in the x direction, and each edge insulating layer 130 may contact the head portion BL2b of the second bit line BL2.

When viewed in a cross-sectional view, the edge insulating layer 130 may contact the buffer layer 110, the first bit line BL1, the first capping layer 118, the insulating liner 122, and the interlayer insulating layer 124. The edge insulating layer 130 may be disposed in the interface area IA, and a lower surface of the edge insulating layer 130 may be disposed at a lower level than the upper surface of the substrate 102; however, the present inventive concept is not limited thereto. For example, the edge insulating layer 130 may be disposed between the first bit line BL1 and the insulating liner 122 and the interlayer insulating layer 124. In an exemplary embodiment of the present inventive concept, a portion of the edge insulating layer 130 may be disposed in the cell area MCA, or the lower surface of the edge insulating layer 130 may be disposed at the same level as the upper surface of the substrate 102. The edge insulating layer 130 may include, for example, silicon oxide, silicon nitride, silicon oxynitride, or a combination thereof.

The second capping layer 140 may be disposed on the first bit line BL1 and the second bit line BL2 while extending in the y direction. For example, in the cell area MCA, the second capping layer 140 may contact the insulating liner 122. In addition, the second capping layer 140 may extend into the interface area IA, and may contact the interlayer insulating layer 124 and the edge insulating layer 130 in the interface area IA. In an exemplary embodiment of the present inventive concept, the second capping layer 140 may be a singular body with the edge insulating layer 130.

The insulating spacers 142 may be disposed at opposite side surfaces of the first bit lines BL1 and the second bit lines BL2, respectively, while extending in the y direction. For example, a part of the insulating spacers 142 may extend into the recess R of the substrate 102, and may cover a side surface of the direct contact DC. As another example, a part of the insulating spacers 142 may cover side surfaces of the buried contact BC. The insulating spacers 142 may also cover side surfaces of the first capping layer 118, the insulating liner 122, the second capping layer 140 and the protrusion 132.

The buried contact BC may be disposed between the first bit lines BL1 and the second bit lines BL2. An upper surface of the buried contact BC may be disposed at a lower level than that of an upper surface of the second capping layer 140. For example, the upper surface of the buried contact BC may be disposed at a level lower than that of a bottom surface of the insulating liner 122. The buried contact BC may extend into the substrate 102. For example, a lower end of the buried contact BC may be disposed at a lower level than the upper surface of the substrate 102, and may contact the active region AR. The semiconductor device 100 may further include fence insulating layers disposed to alternate with the buried contact BC in the y direction when viewed in a plan view. The fence insulating layers may overlap with the gate electrodes WL. The buried contact BC may include, for example, polysilicon.

The semiconductor device 100 may further include a barrier layer 150 formed on the buried contact BC. The barrier layer 150 may be conformally disposed on the insulating spacer 142 and the buried contact BC. In addition, the barrier layer 150 may be disposed on the second capping layer 140.

The landing pad 152 may be disposed on the barrier layer 150. For example, a lower surface of the landing pad 152 may be disposed at a level lower than that of the upper surface of the second capping layer 140, and may correspond to the buried contact BC. An upper surface of the landing pad 152 may be disposed at a higher level than that of the second capping layer 140. The landing pad 152 may be electrically connected to the active region AR via the buried contact BC. The upper surface of the landing pad 152 may correspond to "LP" shown in FIG. 1.

The semiconductor device 100 may further include insulating structures 160 disposed among landing pads 152. For example, the insulating structures 160 may be disposed between the landing pads 152. The insulating structures 160 may electrically insulate the landing pads 152 from one another. The insulating structures 160 may contact protrusions 132 and the second capping layer 140. An upper surface of the insulating structures 160 may be coplanar with the upper surface of the landing pad 152. In an exemplary embodiment of the present inventive concept, the landing pad 152 may include tungsten, and the insulating structure 160 may include silicon oxide.

A capacitor structure of the semiconductor device 100 may be disposed on a corresponding one of the landing pads 152. The capacitor structure may be constituted by the lower electrode 170, the capacitor dielectric layer 172 and the upper electrode 174. The lower electrode 170 may be disposed to contact the corresponding landing pad 152, and the capacitor dielectric layer 172 may be conformally disposed along the insulating structure 160 and the lower electrode 170. The upper electrode 174 may be disposed on the capacitor dielectric layer 172.

The semiconductor device 100 may further include an upper insulating layer 176 disposed on the second capping layer 140. The upper insulating layer 176 may be disposed in the interface area IA, and may contact the upper electrode 174.

FIGS. 3 to 20 are plan views and vertical cross-sectional views illustrating in process order of a method of manufacturing a semiconductor device according to an exemplary embodiment of the present inventive concept. FIGS. 3, 5, 7, 9, 11, 13, 15, 17 and 19 are plan views. FIGS. 4, 6, 8, 10, 12, 14, 16, 18 and 20 are vertical cross-sectional views taken along lines I-I', II-II' and III-III' in FIGS. 3, 5, 7, 9, 11, 13, 15, 17 and 19, respectively.

Figure 3:
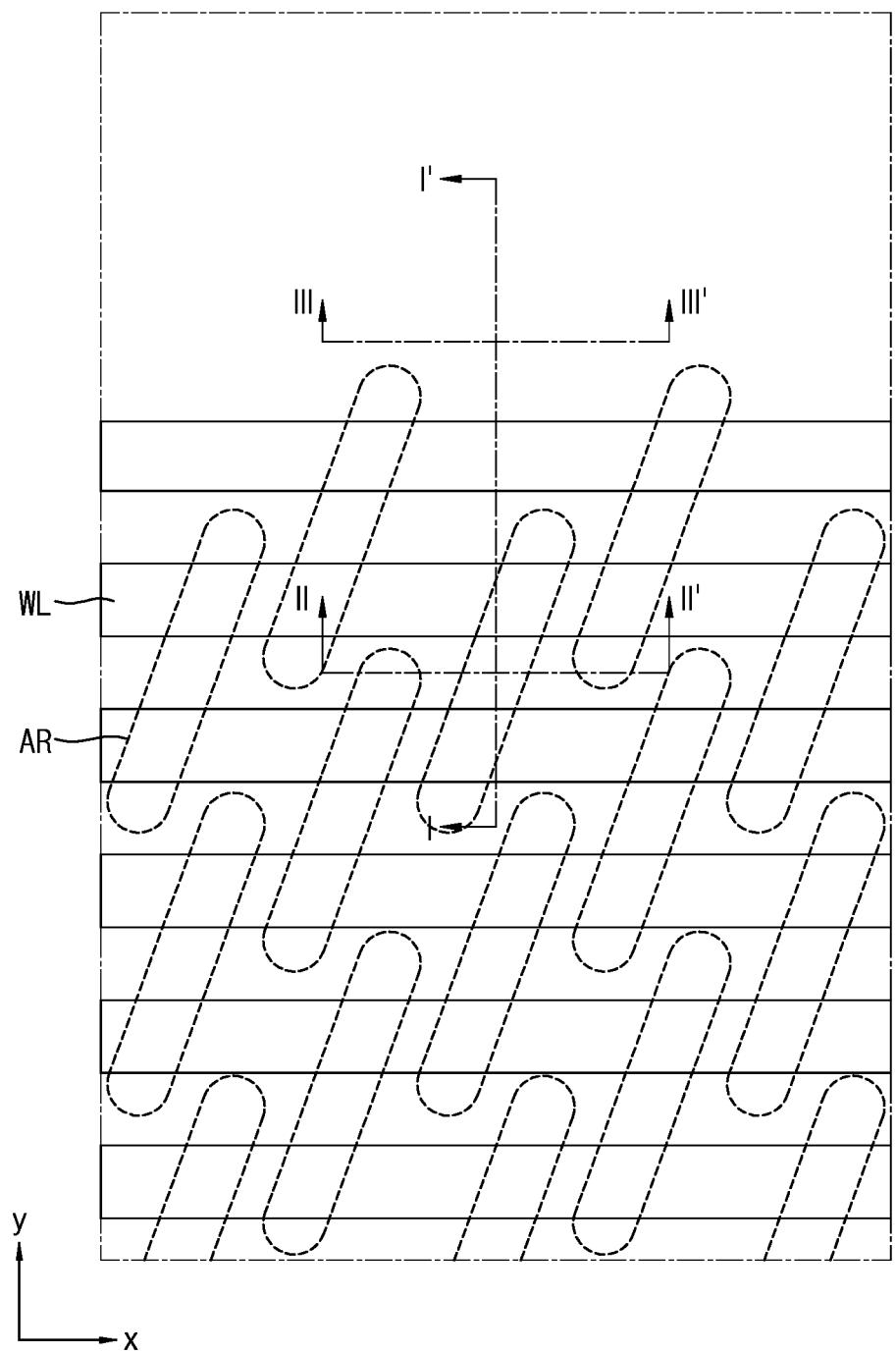
FIGS. 3, 4, 5, 6, 7, 8, 9, 10, 11, 12, 13, 14, 15, 16, 17, 18, 19 and 20 are plan views and cross-sectional views illustrating a process order of a method of manufacturing a semiconductor device according to an exemplary embodiment of the present inventive concept.
Figure 4:
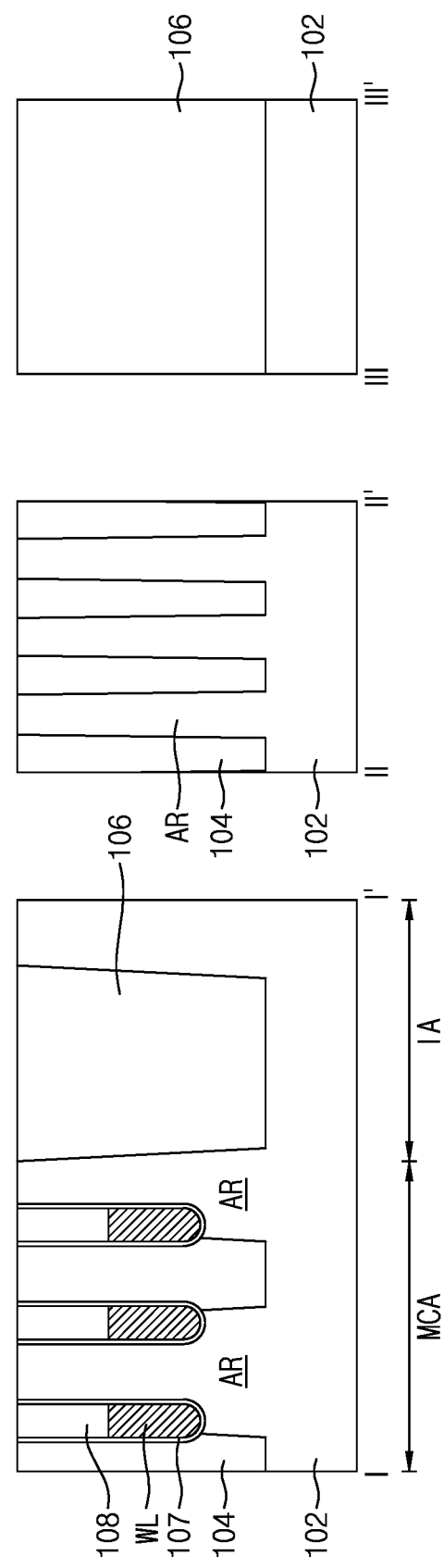

Referring to FIGS. 3 and 4, an element isolation layer 104 and an area separation layer 106 may be formed on a substrate 102. The substrate 102 may include a cell area MCA and an interface area IA. The interface area IA may at least partially surround the cell area MCA, and may be disposed between the cell area MICA and a peripheral circuit area. The element isolation layer 104 may be disposed in the cell area MCA of the substrate 102, and the area separation layer 106 may be disposed in the interface area IA of the substrate 102.

The element isolation layer 104 and the area separation layer 106 may be formed by forming a trench at an upper surface of the substrate 102, and filling the trench with an insulating material. The element isolation layer 104 may define active regions AR in the cell area MCA. For example, the active regions AR may correspond to portions of the upper surface of the substrate 102 surrounded by the element isolation layer 104 in the cell area MCA, respectively. When viewed in a plan view, the active regions AR may have a rectangular shape with rounded sides or a bar shape having a short axis and a long axis longer than the short axis, and may be spaced apart from one another. The element isolation layer 104 and the area separation layer 106 may each include, for example, silicon oxide, silicon nitride, silicon oxynitride, or a combination thereof. The element isolation layer 104 and the area separation layer 106 may each be constituted by a single layer or multiple layers. Although the element isolation layer 104 and the area separation layer 106 are shown as having the same depth, the exemplary embodiments of the present inventive concept are not limited thereto.

Gate electrodes WL may be formed in the cell area MCA, to intersect the active regions AR. For example, the gate electrodes WL may be formed by forming, at the upper surface of the substrate 102, trenches extending in an x direction, forming a gate dielectric layer 107 covering an inner wall of the trench, forming a conductive material at a lower portion of the trench, and forming a gate capping layer 108 at an upper portion of the trench. The gate electrodes WL may be spaced apart from one another in a y direction. An upper surface of the gate capping layer 108 may be coplanar with upper surfaces of the element isolation layer 104 and the area separation layer 106.

The gate electrodes WL may include, for example, Ti, TiN, Ta, TaN, W, WN, TiSiN, WSiN, or a combination thereof. The gate dielectric layer 107 may include, for example, silicon oxide, silicon nitride, silicon oxynitride, high-k dielectrics, or a combination thereof. The gate capping layer 108 may include, for example, silicon oxide, silicon nitride, silicon oxynitride, or a combination thereof.

In an exemplary embodiment of the present inventive concept, after formation of the gate electrodes W L, a source region and a drain region may be formed by implanting impurity ions in portions of the substrate 102 corresponding to the active regions AR at opposite sides of each gate electrode WL. In an exemplary embodiment of the present inventive concept, an impurity ion implantation process for formation of the source region and the drain region may be performed before formation of the gate electrodes WL.

Figure 5:
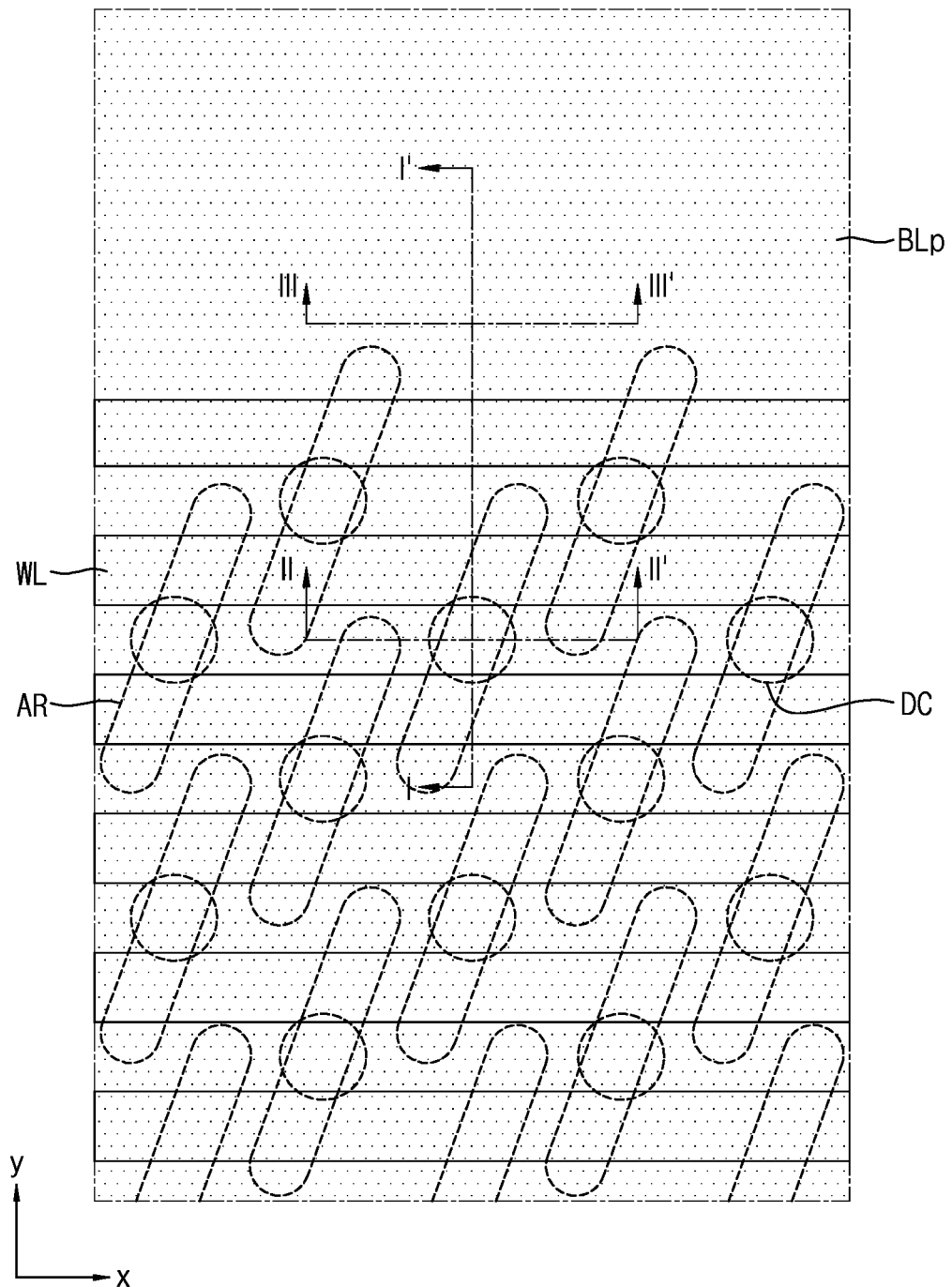
Figure 6:
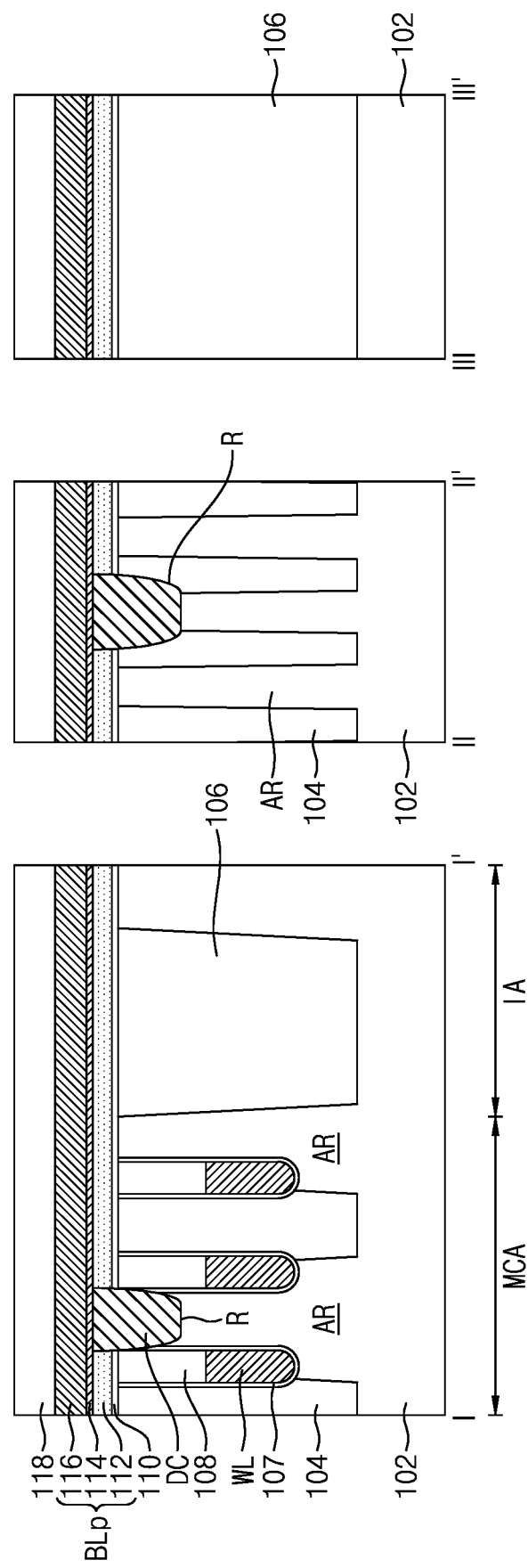

Referring to FIGS. 5 and 6, a buffer layer 110 and a first conductive layer 112 may be formed on the substrate 102. The buffer layer 110 may cover the element isolation layer 104, the area separation layer 106, the active regions AR and the gate capping layer 108. The first conductive layer 112 may cover the buffer layer 110. The buffer layer 110 may include, for example, silicon oxide, silicon nitride, silicon oxynitride, high-k dielectrics, or a combination thereof. The first conductive layer 112 may include, for example, polysilicon.

Thereafter, a recess R may be formed at the upper surface of the substrate 102 by an anisotropic etching process. A direct contact DC may be formed by filling the recess R with a conductive material, and performing a planarization process. An upper surface of the direct contact DC may be coplanar with an upper surface of the first conductive layer 112. The direct contact DC may be formed in the active region AR, and, for example, may contact the source region of the active region AR. In addition, the direct contact DC may extend through the buffer layer 110 and the first conductive layer 112, and may fill the recess R.

A second conductive layer 114, a third conductive layer 116, and a first capping layer 118 may be sequentially stacked on the first conductive layer 112 and the direct contact DC. The first conductive layer 112, the second conductive layer 114 and the third conductive layer 116 may constitute a bit line material layer BLp. The bit line material layer BLp may cover the cell area MCA, the interface area IA and the peripheral circuit area.

The direct contact DC may include, for example, Si, Ge, W, WN, Co, Ni, Al, Mo, Ru, Ti, TiN, Ta, TaN, Cu, or a combination thereof. In an exemplary embodiment of the present inventive concept, the direct contact DC may include polysilicon. Each of the second conductive layer 114 and the third conductive layer 116 may include, for example, TiN, TiSiN, W, tungsten silicide, or a combination thereof. The first capping layer 113 may include, for example, silicon nitride.

Figure 7:
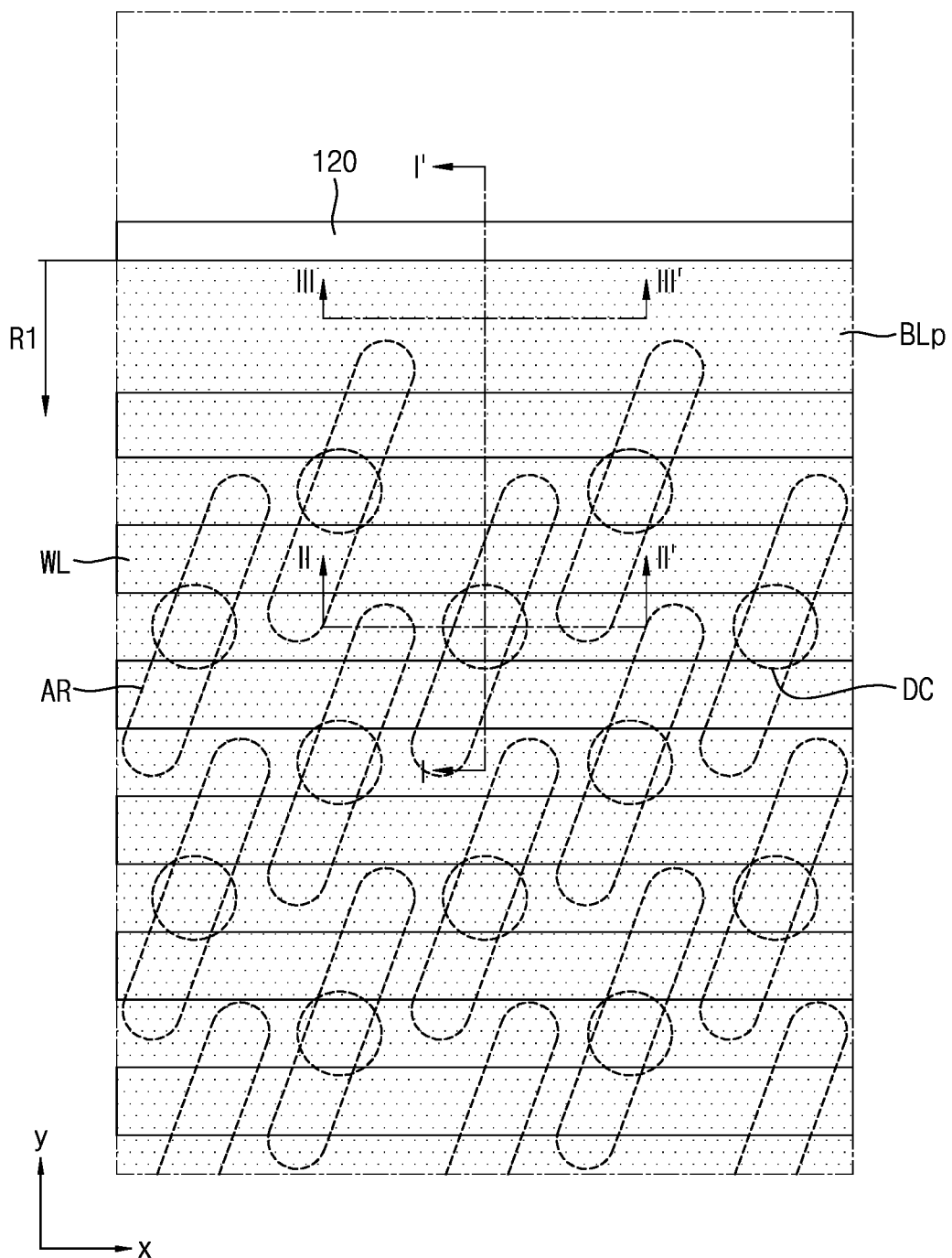
Figure 8:
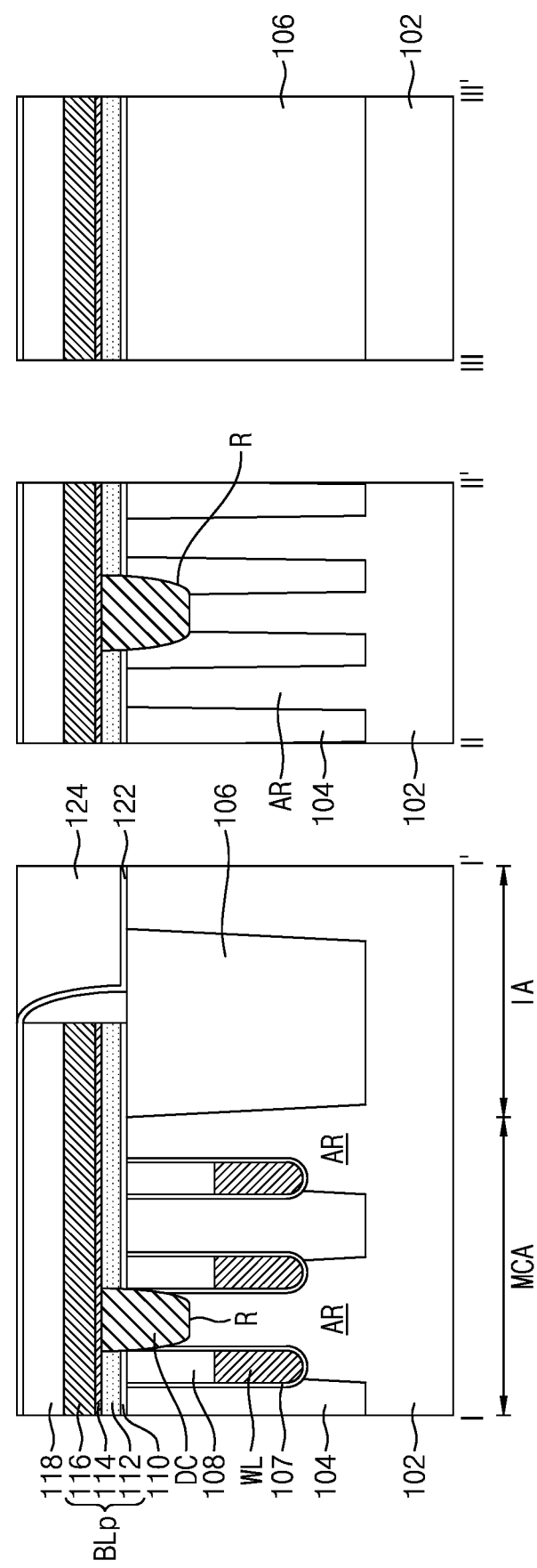

Referring to FIGS. 7 and 8, the bit line material layer BLp and the first capping layer 118 may be partially etched. For example, the bit line material layer BLp may cover the cell area MCA, and an end surface of the bit line material layer BLp may be disposed on the area separation layer 106 in the interface area IA. When viewed in a plan view, an area covered by the bit line material layer BLp may be referred to as a conductive layer separation area R1. For example, the conductive layer separation area R1 may include a portion of the interface area 1A and the cell area MCA. A transistor may be formed in the peripheral circuit area during the etching process.

After etching of the bit line material layer BLp and the first capping layer 118, an edge spacer 120 may be formed by depositing an insulating material, and then performing an anisotropic etching process. The edge spacer 120 may cover the end surface of the bit line material layer BLp and an end surface of the first capping layer 118, and may be disposed on the area separation layer 106 in the interface area IA. The edge spacer 120 may include, for example, silicon oxide, silicon nitride, silicon oxynitride, or a combination thereof. In an exemplary embodiment of the present inventive concept, the edge spacer 120 may include, for example, silicon oxide.

After formation of the edge spacer 120, an insulating liner 122 may be formed by depositing an insulating material. The insulating liner 122 may be conformally formed on the cell area MCA and the interface area IA. An interlayer insulating layer 124 may be formed by depositing an insulating material, and performing a planarization process such that an upper surface of the insulating liner 122 is exposed. An upper surface of the interlayer insulating layer 124 may be coplanar with the upper surface of a portion of the insulating liner 122 that is on the first capping layer 118. For example, a portion of the insulating liner 122 may be disposed on the first capping layer 118 and may be coplanar with the upper surface of the interlayer insulating layer 124, while another portion of the insulating liner 122 may be disposed below the interlayer insulating layer 124. However, exemplary embodiments of the present inventive concept are not limited, to the above-described condition. In an exemplary embodiment of the present inventive concept, a portion of the insulating liner 122 on the first capping layer 118 may be removed by the planarization process and, as such, the upper surface of the interlayer insulating layer 124 may be coplanar with the upper surface of the first capping layer 118. The insulating liner 122 may include, for example, silicon nitride, and the interlayer insulating layer 124 may include, for example, silicon oxide.

Figure 9:
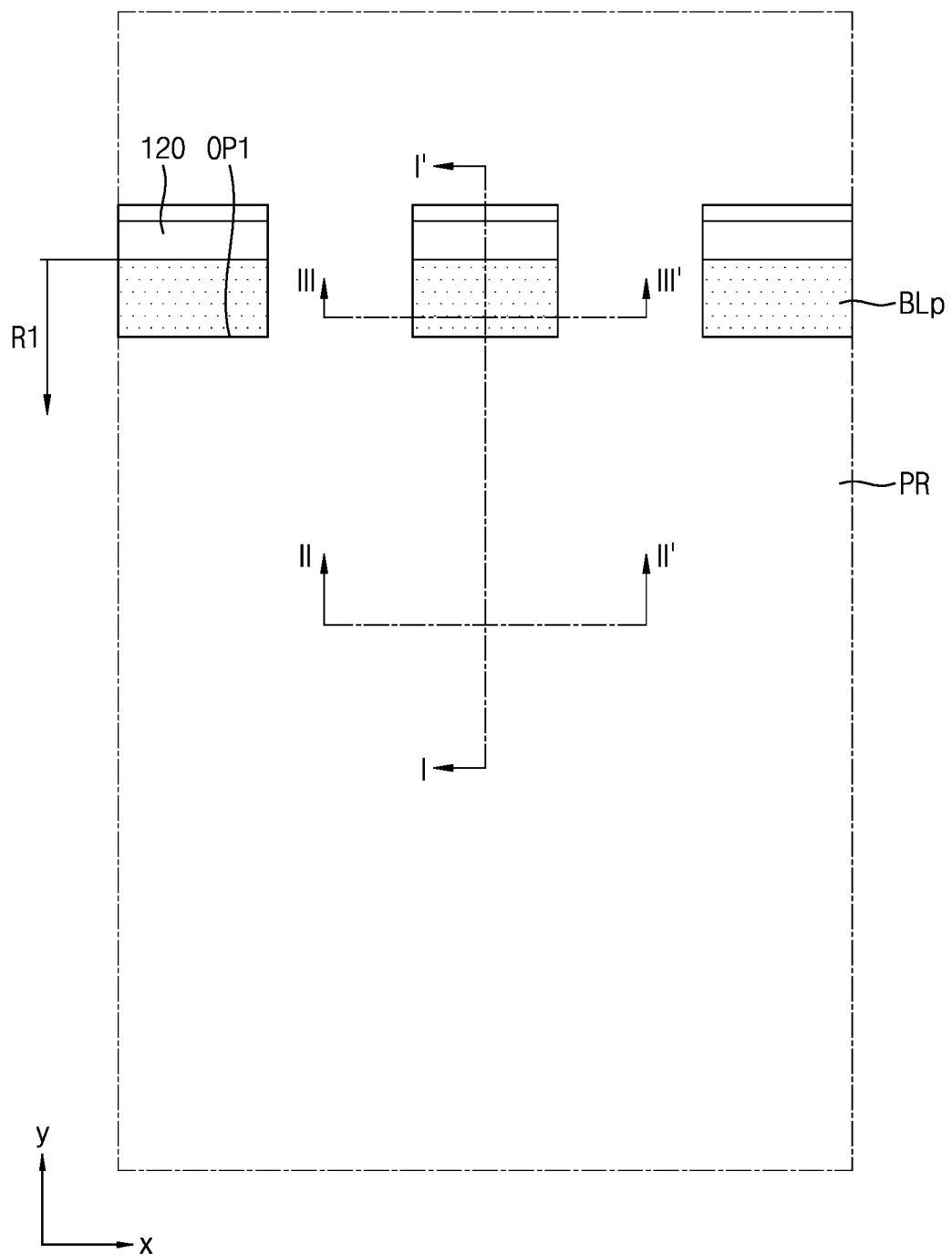
Figure 10:
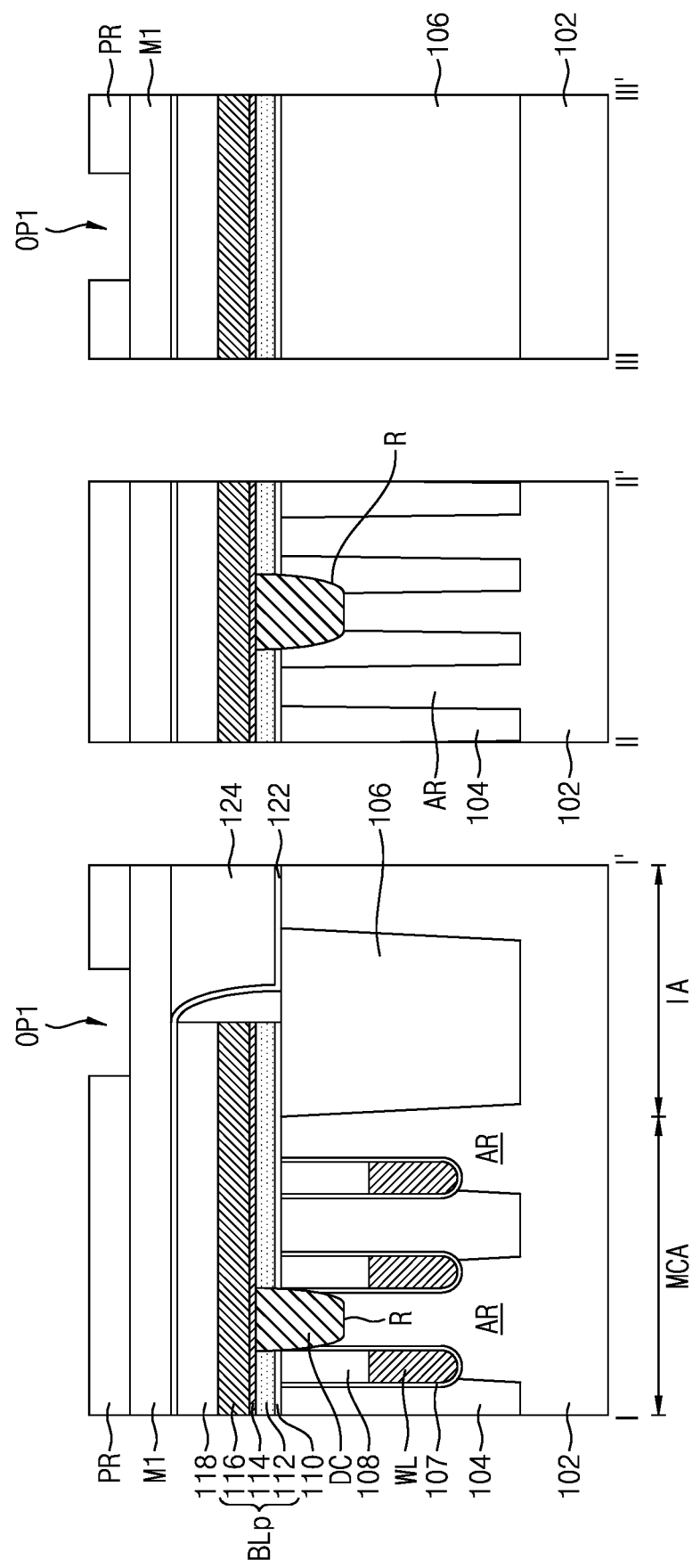

Referring to FIGS. 9 and 10, a first mask layer M1 and a photoresist layer PR may be formed on the insulating liner 122 and the interlayer insulating layer 124. The photoresist layer PR may be disposed on the first mask layer M L, and may include openings OP1. The openings OP1 may be spaced apart from one another in the x direction, and may be disposed in the interface area IA. For example, the y-directional width of each opening OP1 may be greater than the y-directional width of the edge spacer 120, and each opening OP1 may expose an end of the bit line material layer BLp and a portion of the first mask layer M1 corresponding to the edge spacer 120.

Figure 11:
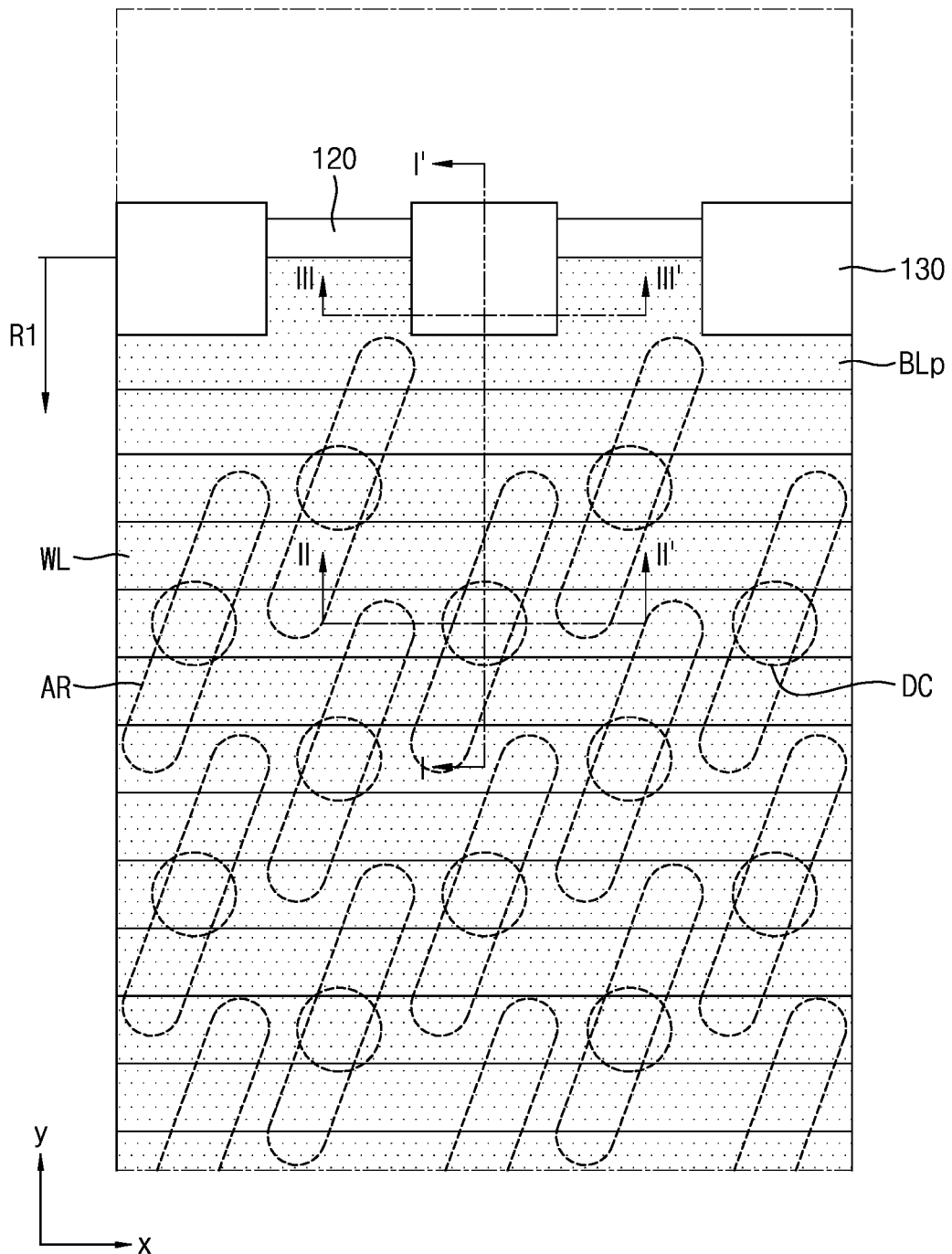
Figure 12:
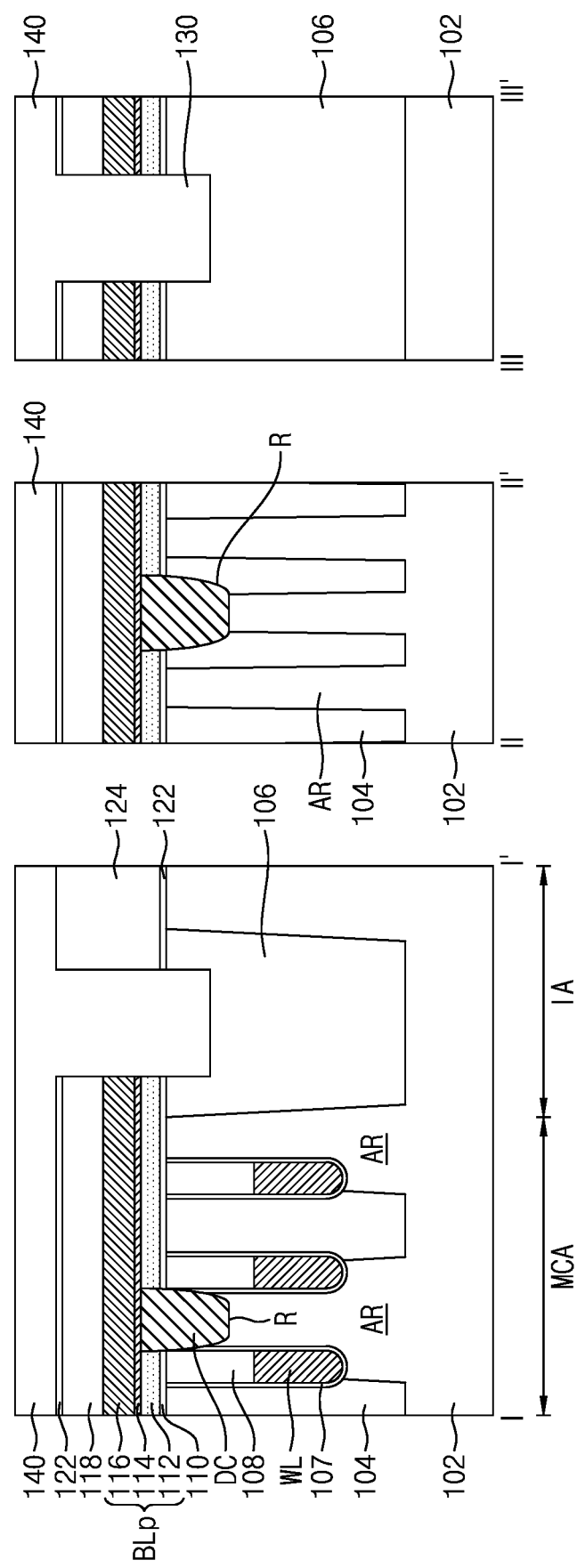

Referring to FIGS. 11 and 12, an anisotropic etching process using the first mask layer M1 as an etch mask may be performed to etch portions of the first mask layer M1 exposed by the openings OP1 of the photoresist layer PR. Thereafter, an edge insulating layer 130 and a second capping layer 140 may be formed through deposition of an insulating material. A portion of the deposited insulating material lower than the upper surface of the interlayer insulating layer 124 may be defined as the edge insulating layer 130. When viewed in a plan view, the edge insulating layer 130 may be formed along a boundary line of the conductive separation area R1. In an exemplary embodiment of the present inventive concept, the edge insulating layer 130 may be a single continuous body with the second capping layer 140. In addition, the edge insulating layer 130 may contact side surfaces of the bit line material layer BLp, the first capping layer 118 and the interlayer insulating layer 124.

Although a lower surface of the edge insulating layer 130 is shown as being disposed at a level lower than the upper surface of the substrate 102, the exemplary embodiments of the present inventive concept are not limited thereto. In an exemplary embodiment of the present inventive concept, the lower surface of the edge insulating layer 130 may be disposed at the same level as the upper surface of the substrate 102, and may contact an upper surface of the area separation layer 106 and not penetrate the area separation layer 106. Although the edge insulating layer 130 is shown as having a rectangular shape when viewed in a plan view, the exemplary embodiments of the present inventive concept are not limited thereto. In an exemplary embodiment of the present inventive concept, the edge insulating layer 130 may have a bar shape, a circular shape or an oval shape. The edge insulating layer 130 and the second capping layer 140 may include, for example, silicon oxide, silicon nitride, silicon oxynitride, or a combination thereof. In an exemplary embodiment of the present inventive concept, the edge insulating layer 130 and the second capping layer 140 may include silicon nitride.

Figure 13:
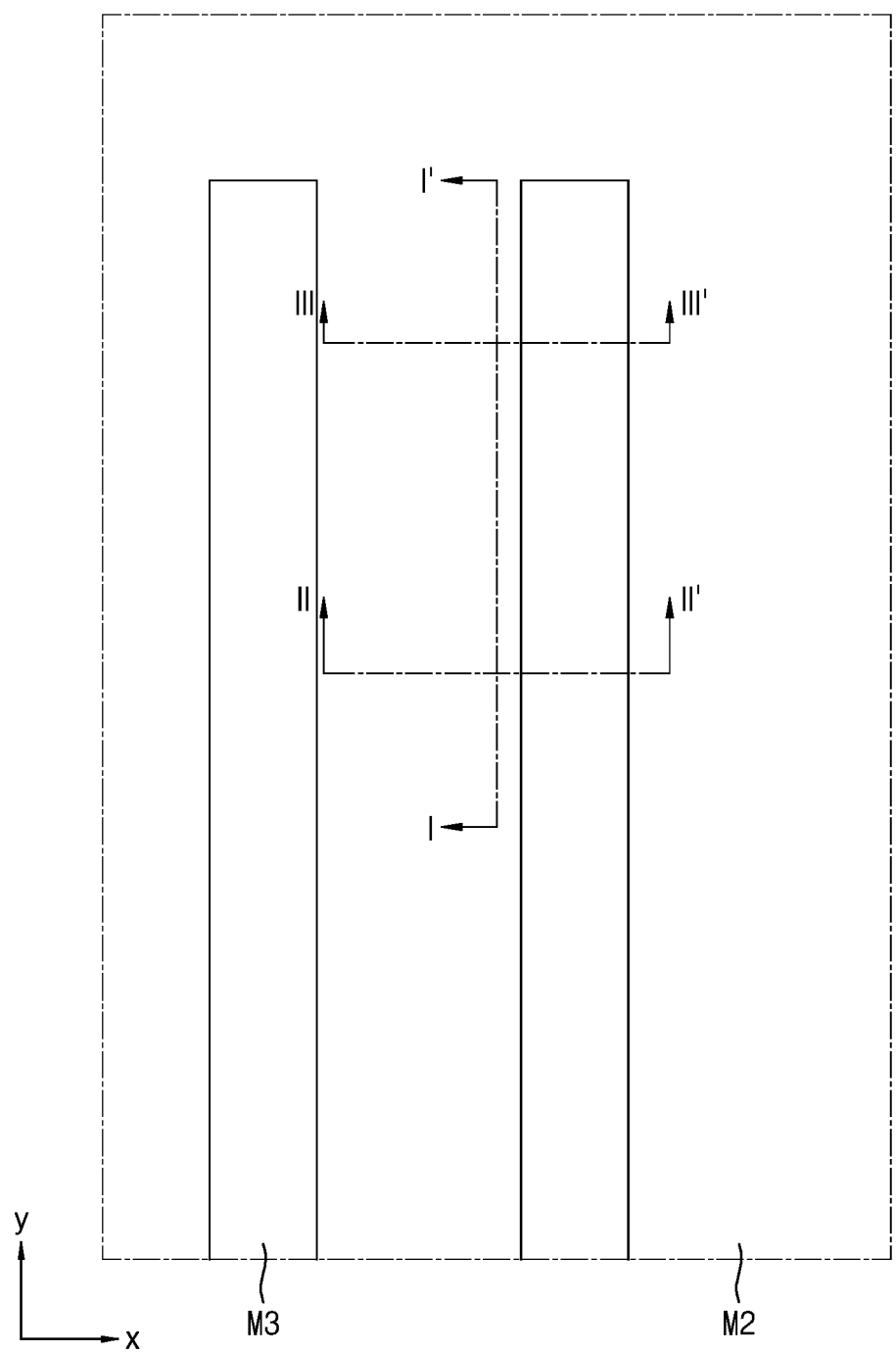
Figure 14:
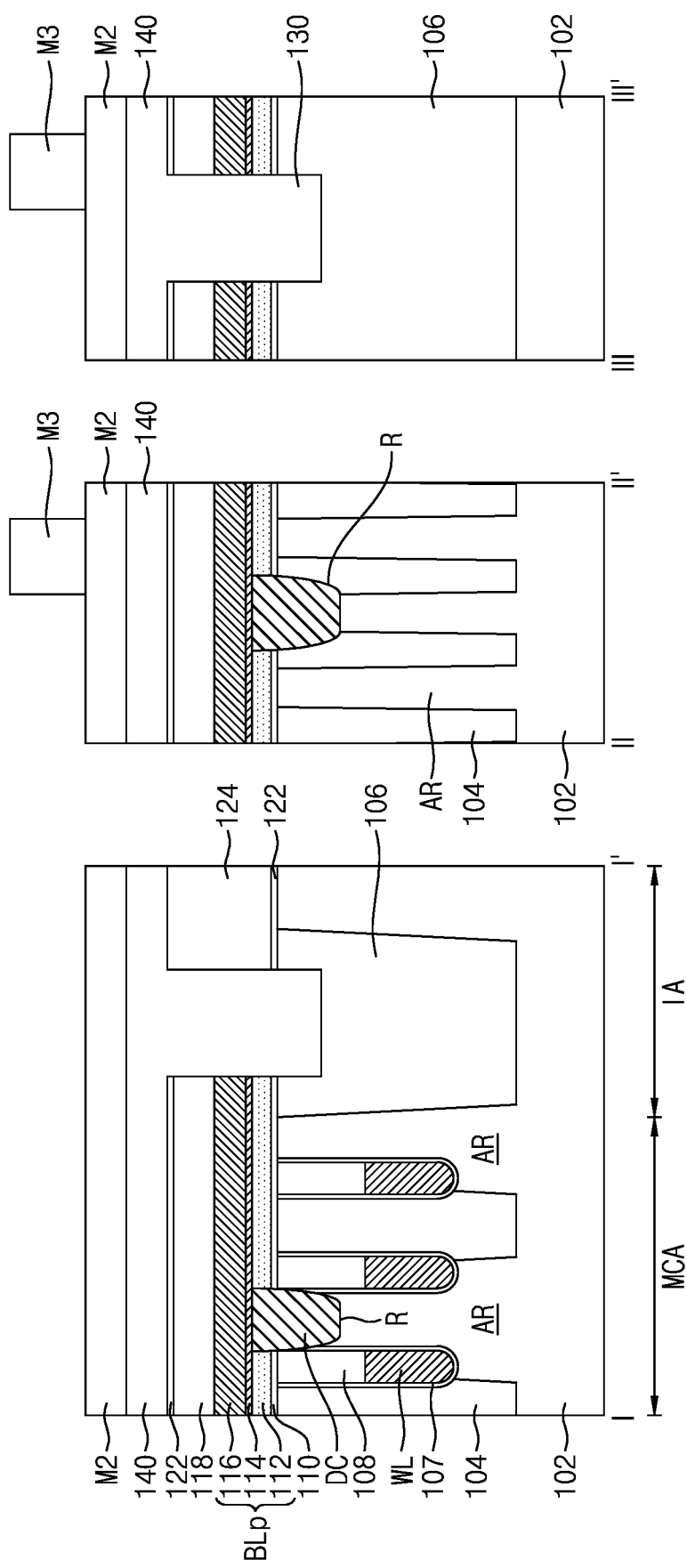

Referring to FIGS. 13 and 14, a second mask layer M2 and a third mask layer M3 may be formed on the second capping layer 140. The second mask layer M2 may have a flat plate shape or a polygonal shape, and the third mask layer M3 may have a linear or bar shape or a rectangular shape. The third mask layer M3 may be formed by a patterning process using a photoresist formed on the third mask layer M3 as an etch mask.

Figure 15:
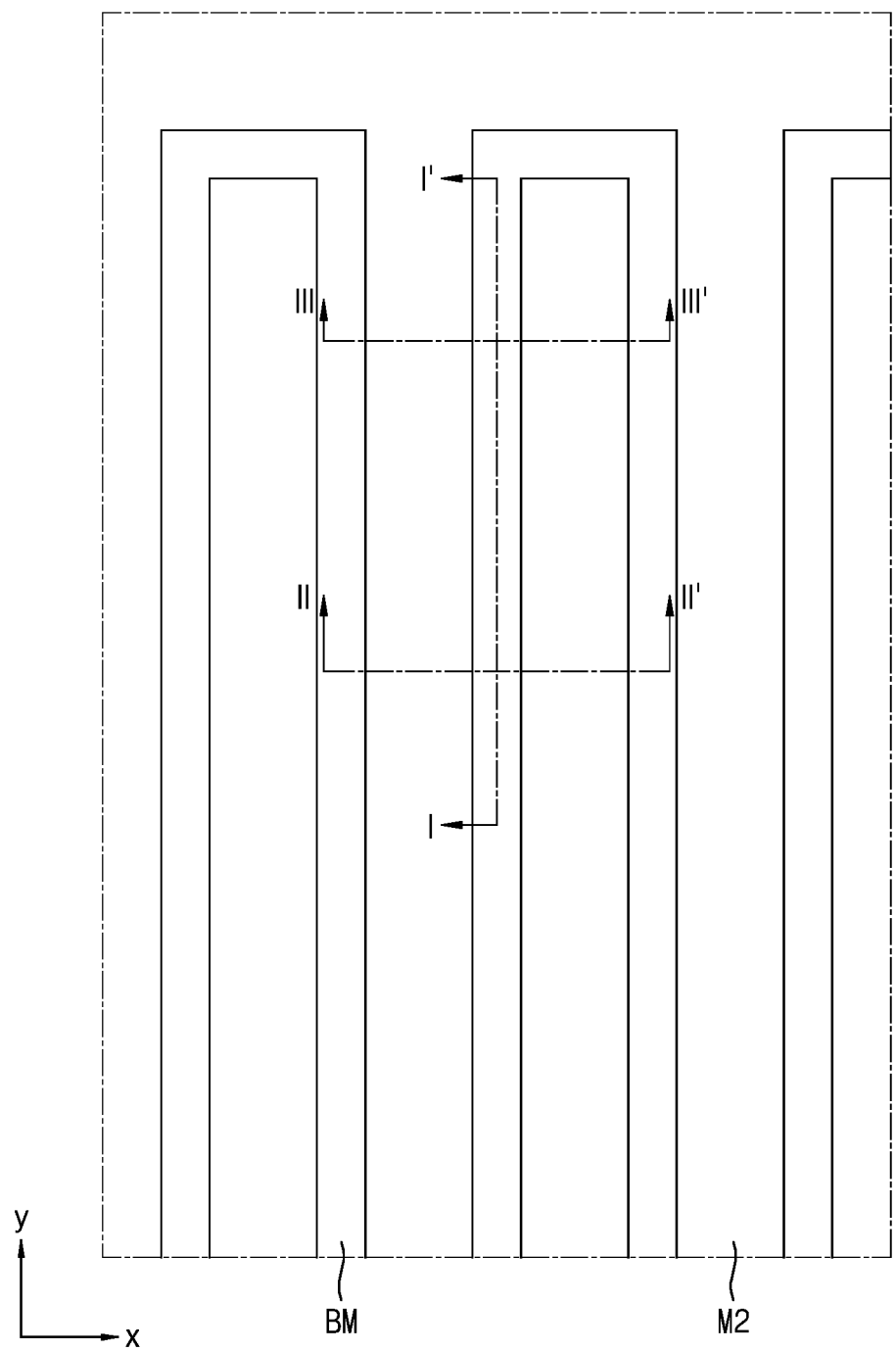
Figure 16:
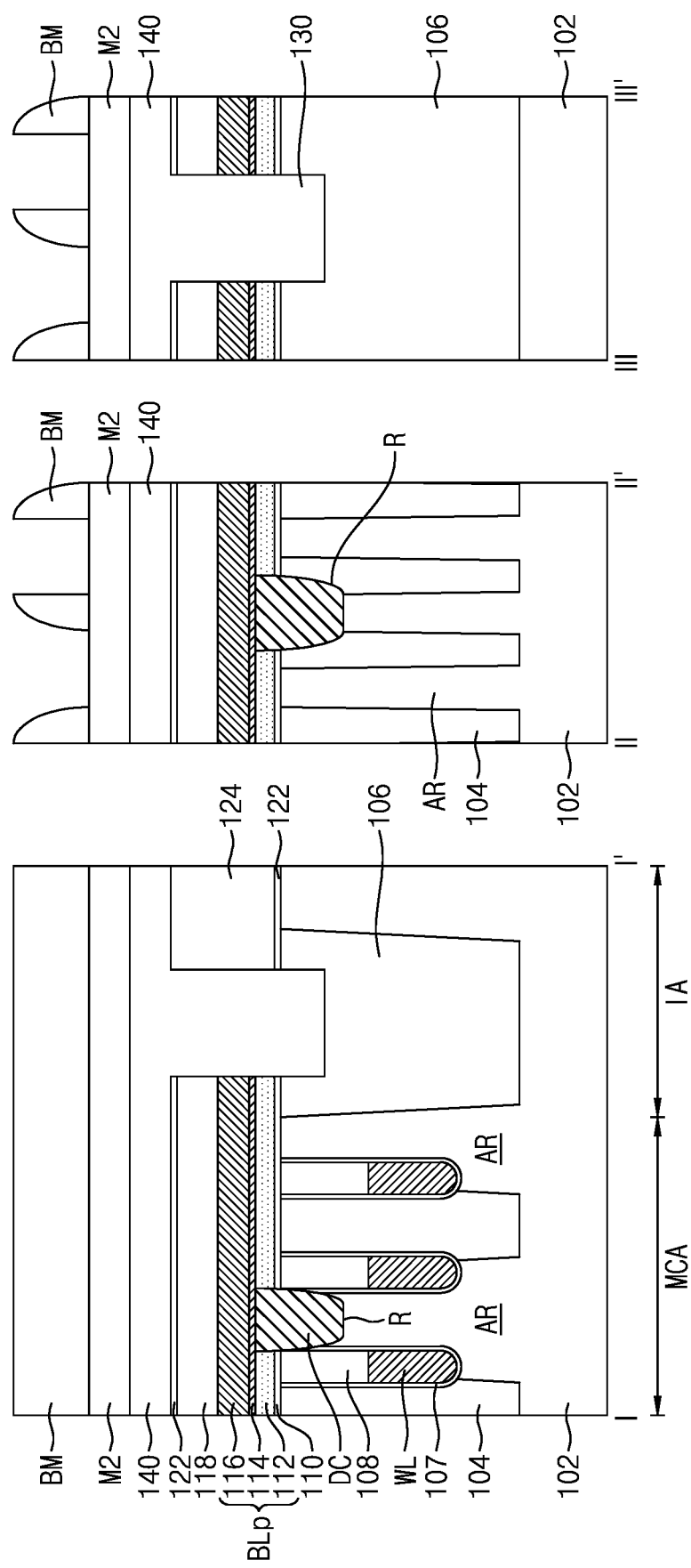

Referring to FIGS. 15 and 16, a bit line mask layer BM may be formed, and the third mask layer M3 may be removed. Prior to the removal of the third mask layer M3, the bit line mask layer BM may be formed at a side surface of the third mask layer M3. For example, when viewed in a plan view, the bit line mask layer BM may have a bar shape or a rectangular shape extending along the side surface of the third mask layer M3. The bit line mask layer BM may be formed by depositing an insulating material covering the second mask layer M2 and the third mask layer M3, and then anisotropically etching the insulating material.

Figure 17:
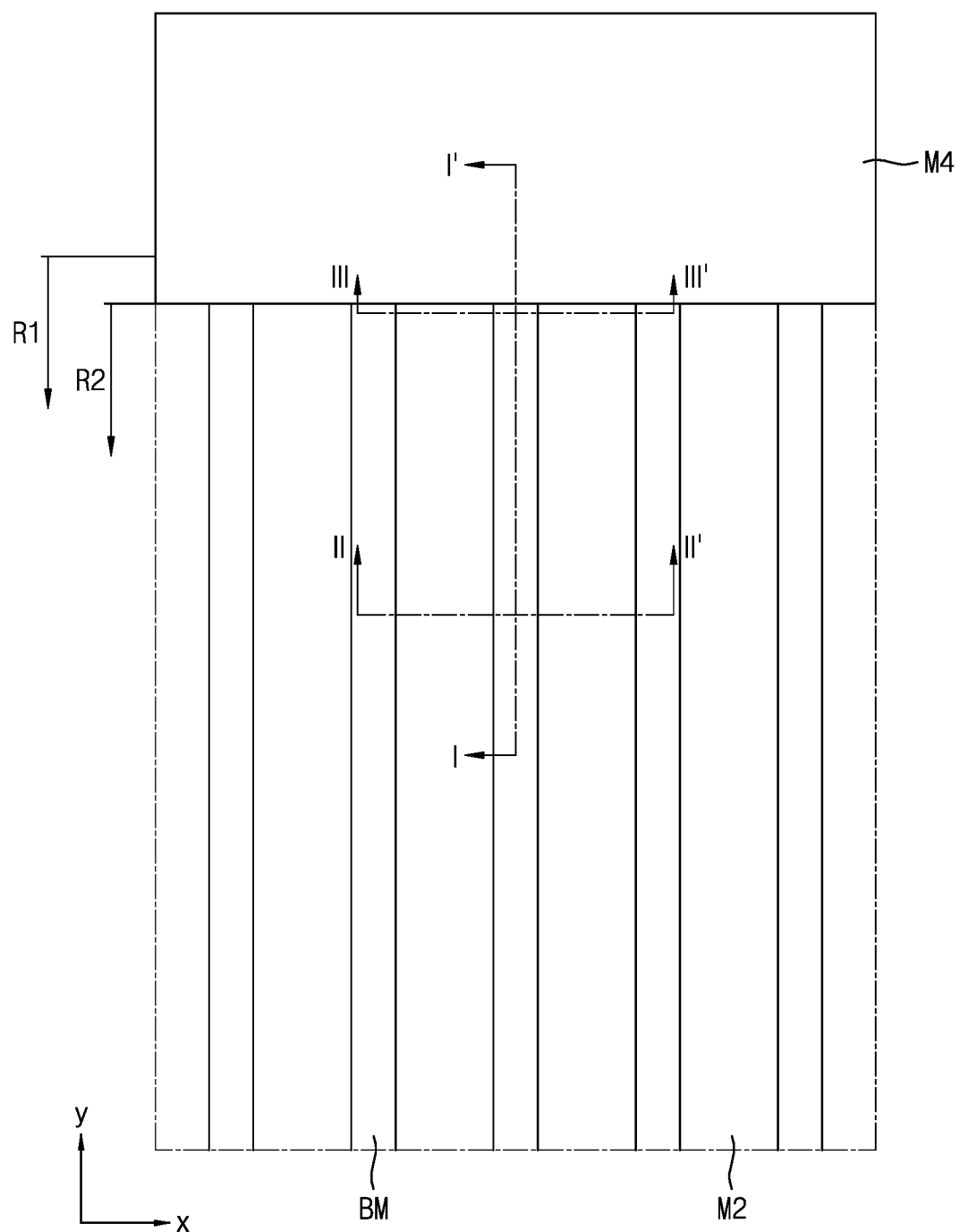
Figure 18:
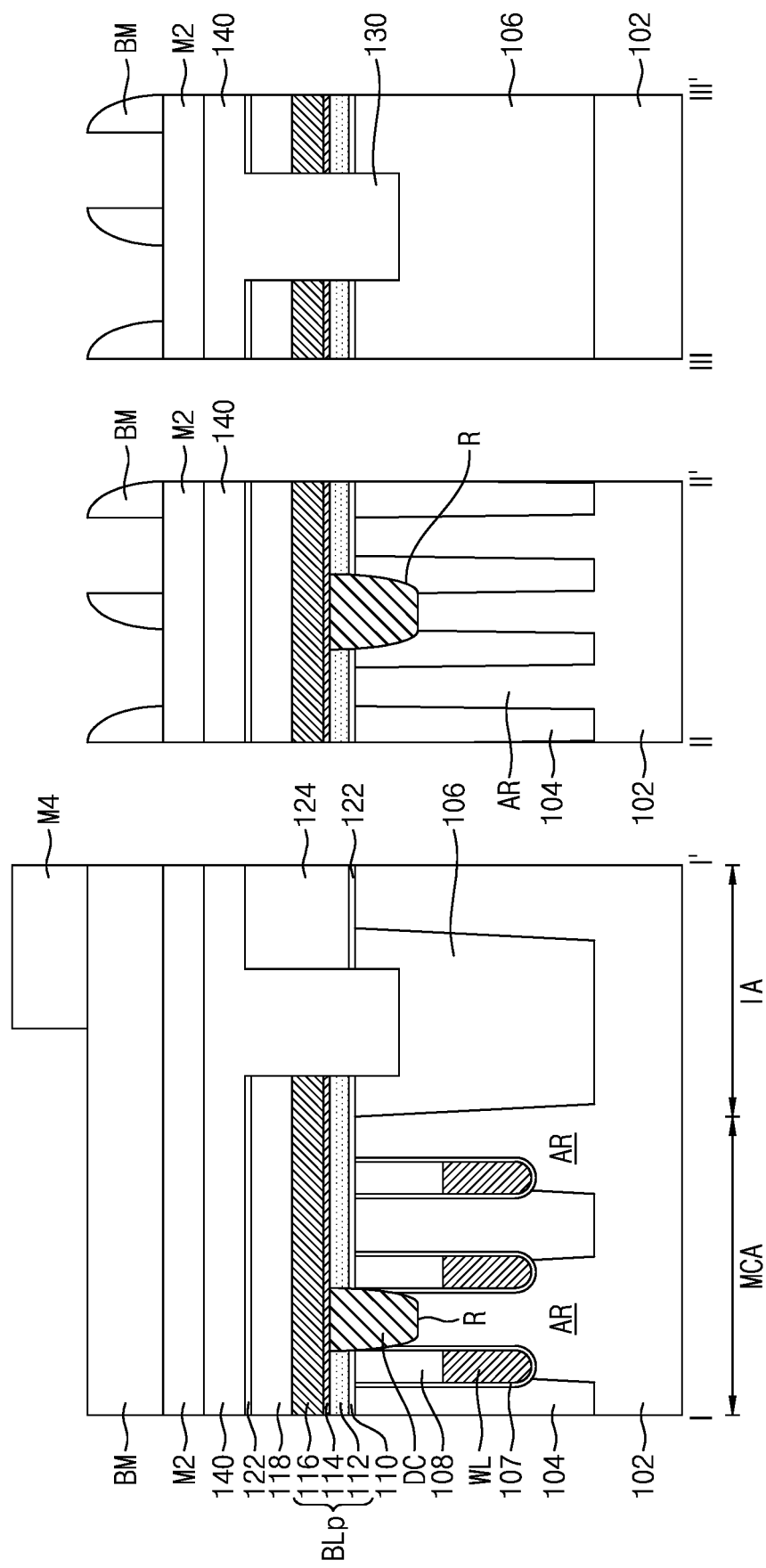

Referring to FIGS. 17 and 18, a fourth mask layer M4 partially covering the bit line mask layer BM may be formed on the second mask layer M2 and the bit line mask layer BM. The fourth mask layer M4 may expose a portion of the interface area IA and the cell area MCA. The areas exposed by the fourth mask layer M4 may be referred to as a bit line etching area R2. The bit line etching area R2 may be disposed farther inwards with respect to the cell area MCA than the conductive layer separation area R1. For example, a boundary line of the bit line etching area. R2 may be nearer to the cell are MCA than the boundary line of the conductive layer separation area R1.

Figure 19:
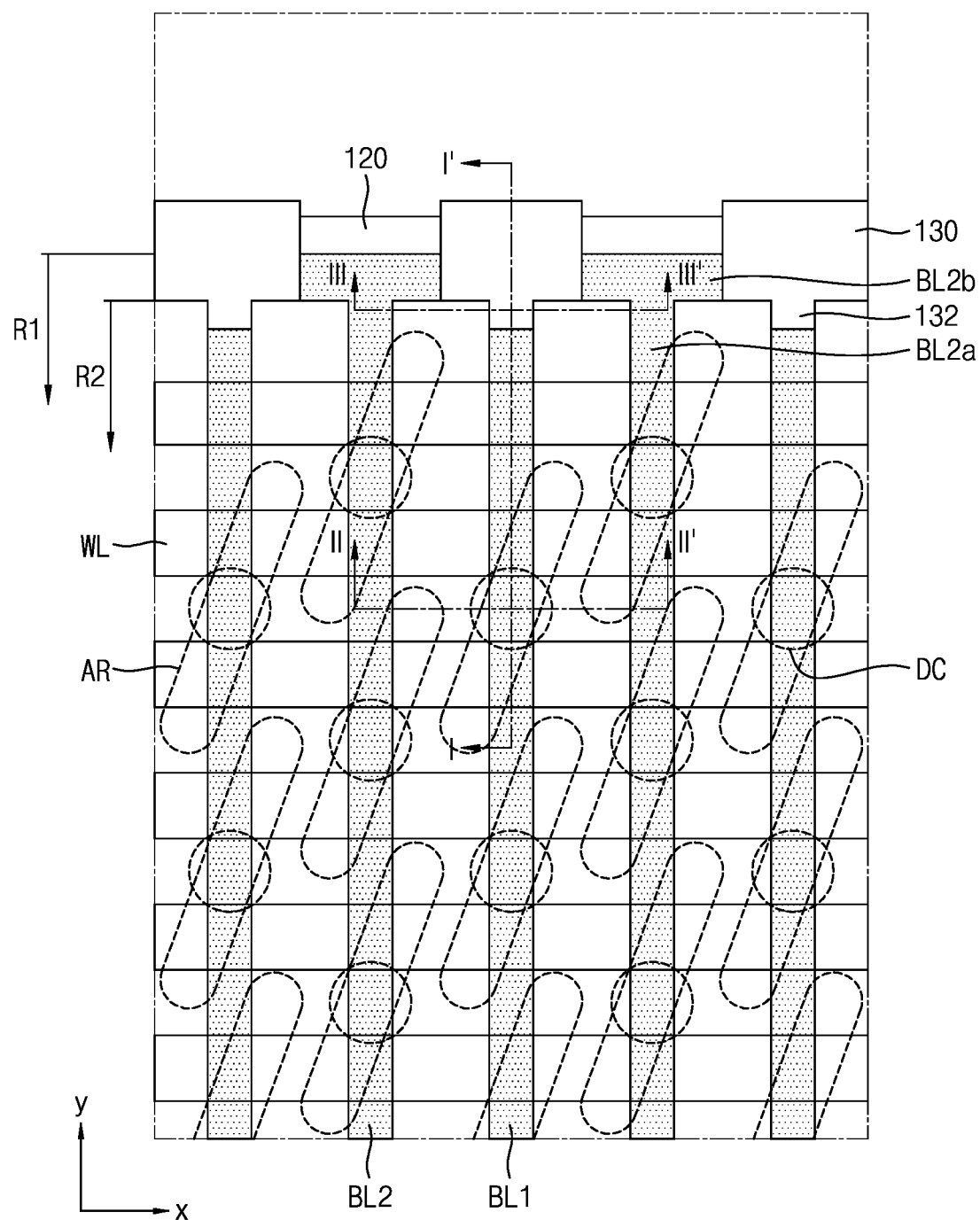
Figure 20:
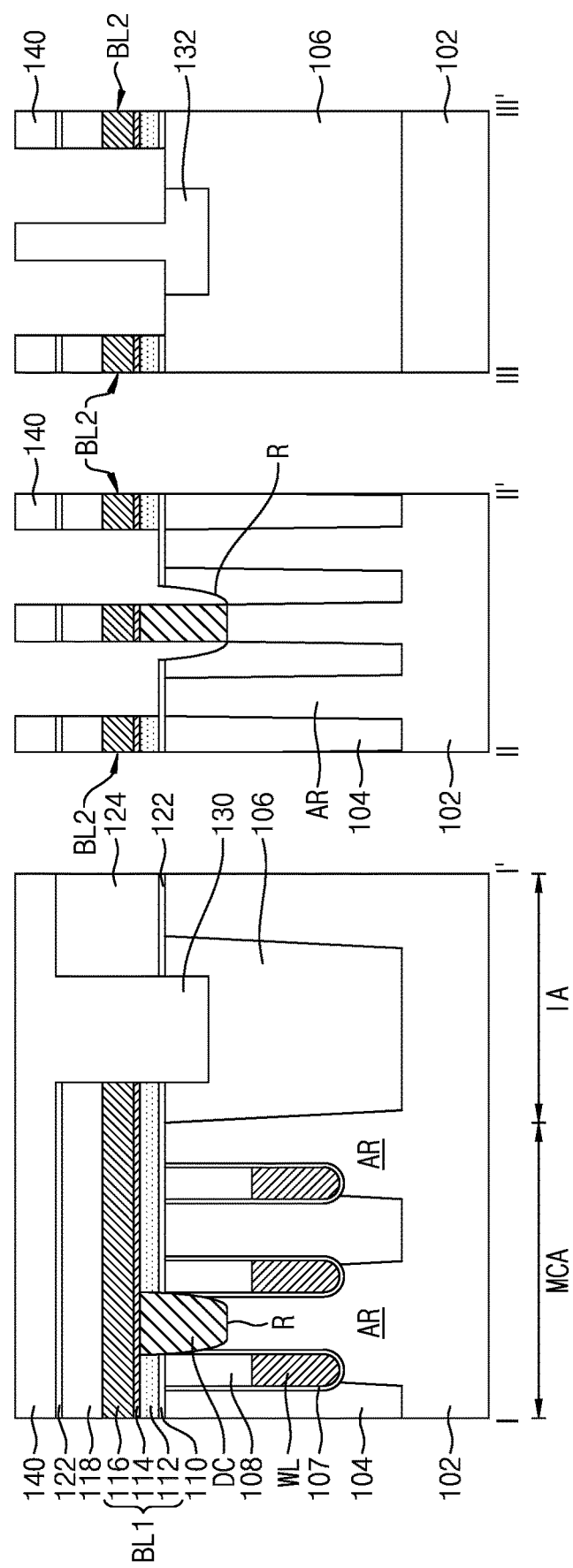

Referring to FIGS. 19 and 20, the bit line material layer BLp may be etched, thereby forming bit lines. The bit lines may be formed by performing an etching process on the bit line material layer BLp by using the bit line mask layer BM not covered by the fourth mask layer M4 as an etch mask. When viewed in a plan view, the bit lines may include a first bit line BL1 and a second bit line BL2. The first bit line BL1 may have a bar shape extending in the y direction. The second bit line BL2 may have a T shape. For example, the second bit line BL2 may include a bar-shaped tail portion BL2a extending in the y direction, and a head portion BL2h connected to a y-directional end of the tail portion BL2a while extending in the x direction. The tail portion BL2a and the head portion BL2b may meet at the boundary line of the bit line etching area R2. The second bit line BL2 may longer in the y direction than the first bit line BL1. For example, the y-directional length of the tail portion BL2a may be greater than the y-directional length of the first bit line BL1. The x-directional width of the head portion BL2b may be greater than the x-directional width of the tail portion BL2a. When viewed in a plan view, the head portion BL2b may be disposed between edge insulating layers 130, and may contact the edge spacer 120.

During formation of the bit lines, the edge insulating layer 130 may be etched at a portion thereof not overlapping with the bit line mask layer BM in a vertical direction. For example, when viewed in a plan view, the edge insulating layer 130 may include a protrusion 132 protruding toward the first bit line BL1 in the y direction. The protrusion 132 may contact the first bit line BL1, and the x-directional width of the protrusion 132 may be substantially equal to the x-directional width of the first bit line BL1. The edge insulating layer 130 may electrically insulate adjacent ones of the bit lines from each other. For example, the edge insulating layer 130 may electrically separate the first bit line BL1 from the second bit line BL2.

Protrusions 132 and second bit lines BL2 may be alternately disposed in the x direction. When viewed in a cross sectional view along line III-III', a portion of the protrusion 132 may be disposed in the area separation layer 106, and the portion of the protrusion 132 disposed in the area separation layer 106 may have a greater horizontal width than a portion of the protrusion 132 not disposed in the area separation layer 106. In addition, for example, the direct contact DC in the recess R may be exposed.

When both the edge spacer 120 and the interlayer insulating layer 124 under the second capping layer 140 are etched upon etching the bit line material layer BLp, the edge spacer 120 or the interlayer insulating layer 124 may collapse. However, when the bit line etching area R2 is set to be disposed farther inwards than the conductive layer separation area R1, as shown in FIGS. 19 and 20, the edge spacer 120 or the interlayer insulating layer 124 may not be etched during etching of the bit line material layer BLp. Accordingly, bridging between nodes may be prevented or reduced, and reliability of the resultant device may be increased.

Again, referring to FIGS. 1 and 2, an insulating spacer 142 and a buried contact BC may be formed. Insulating spacers 142 may be formed by depositing an insulating material on the resultant structure of FIGS. 19 and 20, and anisotropically etching the insulating material. The insulating spacer 142 may cover side surfaces of the bit lines BL1 and BL2, the direct contact DC and the edge insulating layer 130. For example, the insulating spacer 142 may be disposed on side surfaces of the protrusions 132.

When viewed in a plan view, buried contacts BC may be disposed between the bit lines BL1 and BL2, and may be disposed not to overlap with the gate electrodes WL in a vertical direction. Fence insulating layers overlapping with the gate electrodes WL may further be formed at opposite sides of the bit lines BL1 and BL2. The buried contacts BC and the fence insulating layers may be alternately disposed in the y direction between the bit lines BL1 and BL2. In an exemplary embodiment of the present inventive concept, the buried contacts BC may be formed earlier than the fence insulating layers. For example, buried contacts BC arranged in the y direction may be formed between the bit lines BL1 and BL2, and fence insulating layers may then be formed by etching portions of the buried contacts BC overlapping with the gate electrodes WL, and depositing an insulating material. In an exemplary embodiment of the present inventive concept, the fence insulating layers may be formed earlier than the buried contacts BC. For example, sacrificial layers extending in the y direction may be formed between the bit lines BL1 and BL2. In addition, fence insulating layers may be formed at portions of the sacrificial layers overlapping with the gate electrodes WL. Further, buried contacts BC may then be formed by removing the sacrificial layers, and depositing a conductive material at opposite sides of the bit lines BL1 and BL2.

The buried contact BC may extend into the substrate 102. For example, a lower end of the buried contact BC may be disposed at a level lower than the upper surface of the substrate 102, and may contact the drain region of the active region AR. Upon forming the buried contact BC, the edge insulating layer 130 may be partially etched, and the buried contact BC may contact the edge insulating layer 130. For example, the buried contact BC may contact the protrusion 132 of the edge insulating layer 130. Although the lower end of the buried contact BC is disposed at the same level as a lower surface of the edge insulating layer 130, the present inventive concept is not limited thereto. In an exemplary embodiment of the present inventive concept, the lower surface of the edge insulating layer 130 may be disposed at a level higher or lower than the lower end of the buried contact BC. The buried contact BC may include, for example, polysilicon.

Thereafter, a barrier layer 150, a landing pad 152, and an insulating structure 160 may be formed. The barrier layer 150 may be conformally formed on the insulating spacer 142 and the buried contact BC. Before formation of the barrier layer 150, an etch-back process for partially removing the buried contact BC may further be performed. The landing pad 152 may be formed by depositing a conductive material on the barrier layer 150, etching a portion of the conductive material, and filling the etched portion of the conductive material with the insulating structure 160. The insulating structure 160 may be disposed between adjacent landing pads 152, and may electrically insulate the landing pads 152 from each other. An upper surface of the insulating structure 160 and an upper surface of the landing pad 152 may be coplanar. The barrier layer 150 may include metal silicide such as cobalt silicide, nickel silicide and manganese silicide. The landing pad 152 may include, for example, polysilicon, metal, metal silicide, conductive metal nitride, or a combination thereof, in an embodiment, the landing pad may include tungsten. The insulating structure 160 may include, for example, silicon oxide, silicon nitride, silicon oxynitride, or a combination thereof.

Subsequently; a lower electrode 170, a capacitor dielectric layer 172, an upper electrode 174 and an upper insulating layer 176 may be formed and, as such, a semiconductor device 100 may be formed. The lower electrode 170 may be disposed to overlap to the landing pad 152. For example, the lower electrode 170 may be aligned with the landing pad 152. For example, the lower electrode 170 may contact the upper surface of the landing pad 152, and may be electrically connected to the drain region via the landing pad 152 and the buried contact BC. In an exemplary embodiment of the present inventive concept, the lower electrode 170 may have a pillar shape; however, the present inventive concept is not limited thereto. In an exemplary embodiment of the present inventive concept, the lower electrode 170 may have a cylindrical shape or a hybrid shape of a pillar shape and a cylindrical shape.

The capacitor dielectric layer 172 may be conformally formed along surfaces of the upper insulating structures 160 and the lower electrode 170. The upper electrode 174 may be formed on the capacitor dielectric layer 172. The lower electrode 170, the capacitor dielectric layer 172 and the upper electrode 174 may constitute a capacitor structure of the semiconductor device 100. The upper insulating layer 176 may be formed at the same level as the upper electrode 174 in the interface area IA. Although a boundary line between the upper electrode 174 and the upper insulating layer 176 is shown as being aligned with an end surface of the first bit line BL1, the present inventive concept is not limited thereto.

The lower electrode 170 may include a metal such as Ti, W, Ni, Co or a metal nitride such as TiN, TiSiN, TiAlN, TaN, TaSiN, WN, etc. In an exemplary embodiment of the present inventive concept, the lower electrode 170 may include TiN. The capacitor dielectric layer 172 may include a metal oxide such as $HfO_2$, $ZrO_2$, $Al_2O_3$, $La_2O_3$, $Ta_2O_3$, and $TiO_2$, a dielectric material having a perovskite structure such as $SrTiO_3$(STO), $BaTiO_3$, PZT and PLZT, or a combination thereof. The upper electrode 174 may include a metal such as Ti, W, Ni and Co or a metal nitride such as TiN, TiSiN, TiAlN, TaN, TaSiN, WN, etc. The upper insulating layer 176 may include, for example, silicon oxide, silicon nitride, silicon oxynitride, or a combination thereof.

Figure 21A:
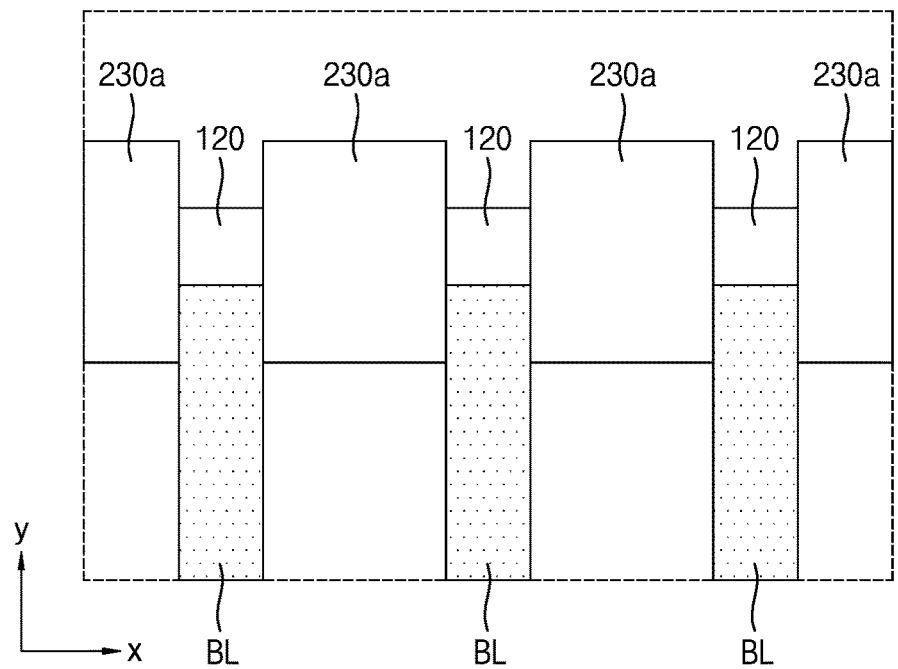
FIGS. 21A and 21B are plan views of semiconductor devices according to exemplary embodiments of the present inventive concept.
Figure 21B:
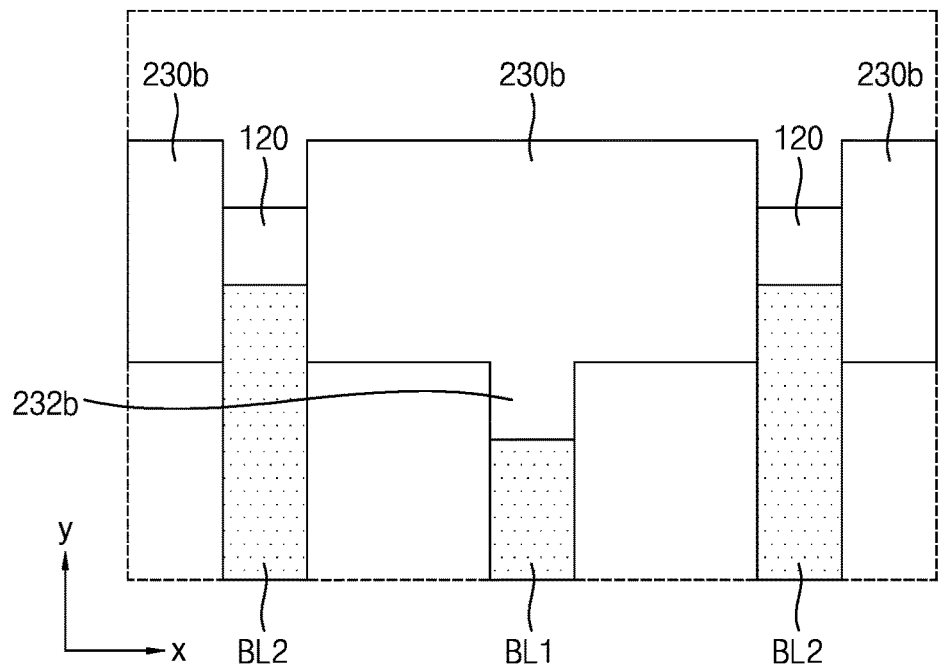

FIGS. 21A and 21B are plan views of semiconductor devices according to exemplary embodiments of the present inventive concept.

Referring to FIG. 21A, a semiconductor device 200a may include edge insulating layers 230a electrically insulating hit lines BL from one another. In an exemplary embodiment of the present inventive concept, the x-directional width of the edge insulating layers 230a may be equal to the distance between adjacent ones of the bit lines BL. The bit lines BL disposed among the edge insulating layers 230a may have the same shape as each other. For example, the bit lines BL may have a rectangular shape or a bar shape. In addition, each bit line BL may partially contact side surfaces of the edge insulating layers 230a adjacent thereto, and may contact an edge spacer 120.

Referring to FIG. 21B, a semiconductor device 200b may include edge insulating layers 230b electrically insulating bit lines BL1 and BL2 from one another, and each of the edge insulating layers 230b may include a protrusion 232b protruding in a y direction. The bit line contacting the protrusion 232b may be referred to as a first bit line BL1, and the bit line contacting the edge spacer 120 may be referred to as a second bit line BL2. In addition, the edge insulating layer 230b may partially contact a side surface of the second bit line BL2 adjacent thereto. In an exemplary embodiment of the present inventive concept, the x-directional width of the edge insulating layer 230b may be equal to the distance between adjacent ones of the second bit lines BL2.

Figure 22:
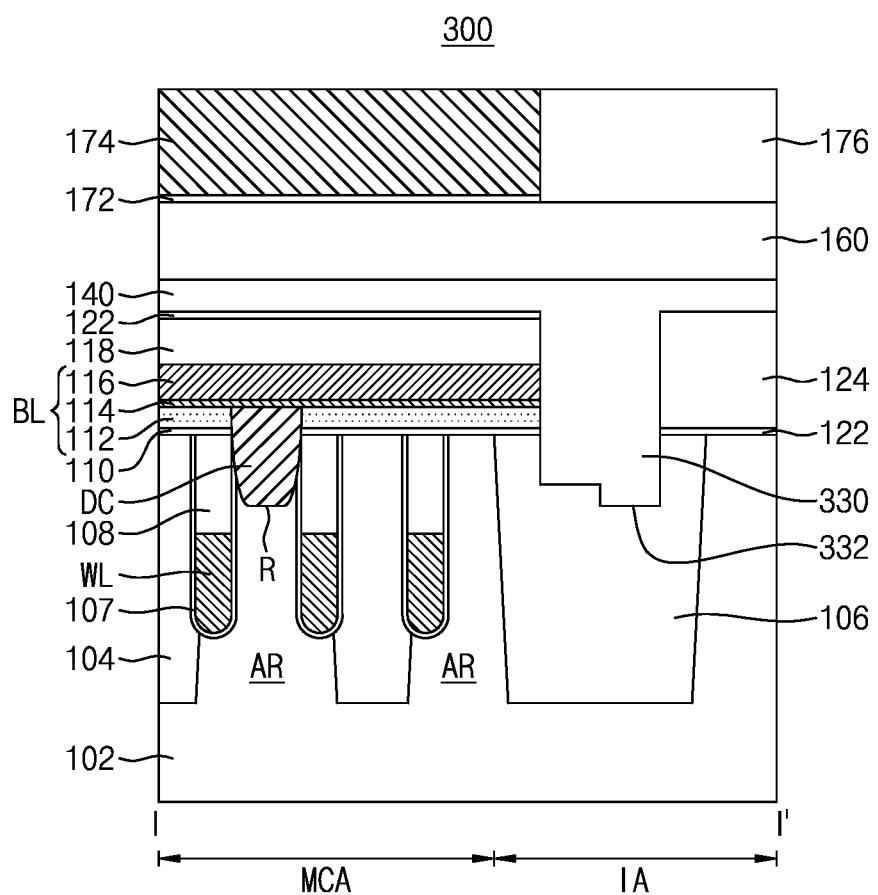
FIG. 22 is a cross-sectional view of a semiconductor device according to an exemplary embodiment of the present inventive concept.

FIG. 22 is a cross-sectional view of a semiconductor device according to an exemplary embodiment of the present inventive concept.

Referring to FIG. 22, a semiconductor device 300 may include an edge insulating layer 330 contacting a bit line BL. In an exemplary embodiment of the present inventive concept, the edge insulating layer 330 may include an extension 332 further extending downwards from a lower surface thereof. For example, in the etching process for the edge spacer 120 described with reference to FIGS. 12 and 13, an area separation layer 106 may be further etched at a portion thereof overlapping with the edge spacer 120 than at a portion thereof overlapping a bit line material layer BLp. For example, the extension 332 may be the portion overlapping the edge spacer 120. When an interlayer insulating layer 124 is partially etched together with the edge spacer 120, the extension 332 may correspond to an etched portion of the interlayer insulating layer 124 and the edge spacer 120. In an exemplary embodiment of the present inventive concept, which will be described later, edge insulating layers may include extensions 332 extending downwards, similarly to the above-described case.

FIGS. 23 to 30 are plan views and cross-sectional views illustrating a process order of a method of manufacturing a semiconductor device according to an exemplary embodiment of the present inventive concept. FIGS. 23, 25, 27 and 29 are plan views. FIGS. 24, 26, 28 and 30 are cross-sectional views taken along lines I-I', II-II' and III-III' in FIGS. 23, 25, 27 and 29, respectively.

Figure 23:
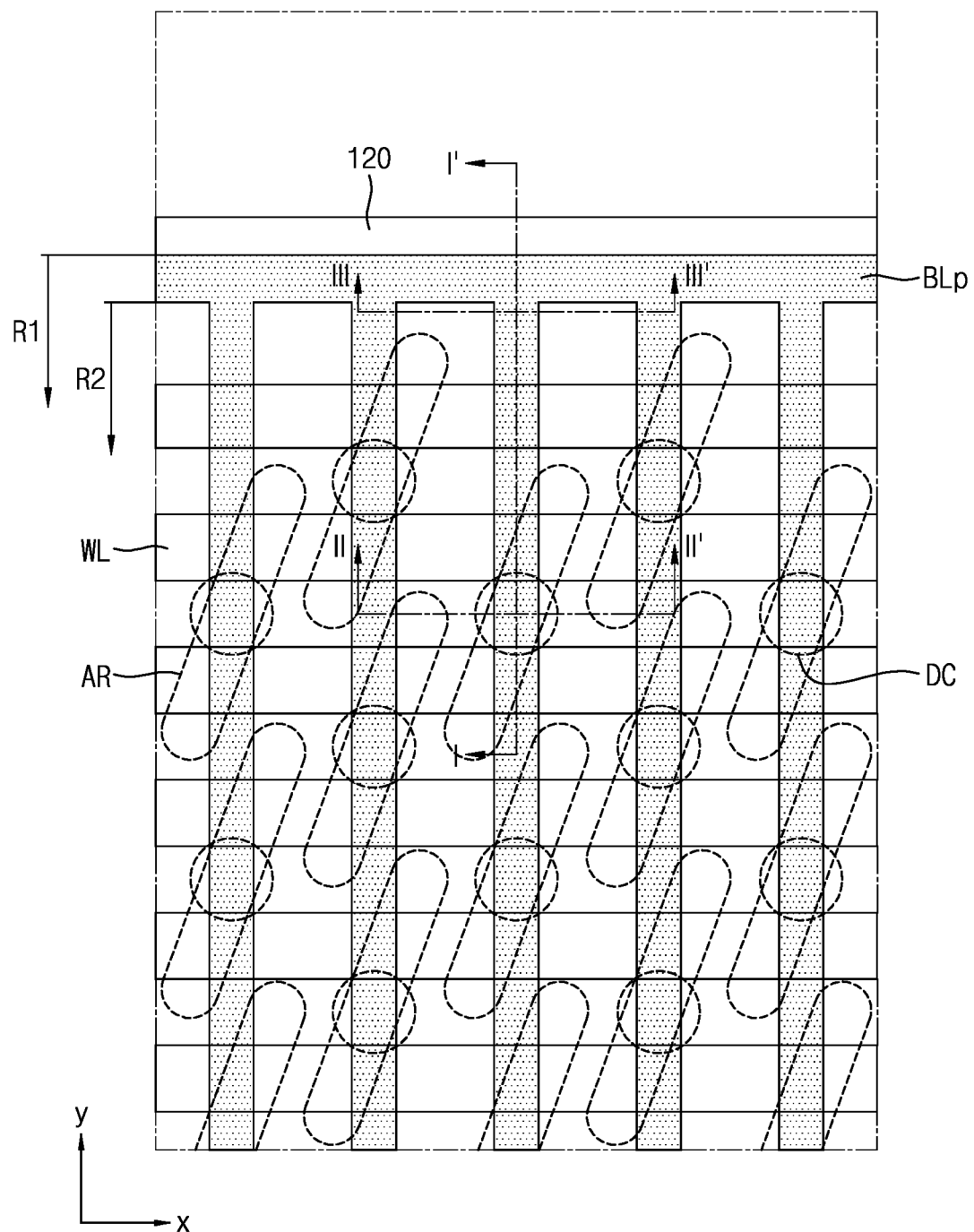
FIGS. 23, 24, 25, 26, 27, 28, 29 and 30 are plan views and cross-sectional views illustrating a process order of a method of manufacturing a semiconductor device according to an example embodiment of the inventive concepts.
Figure 24:
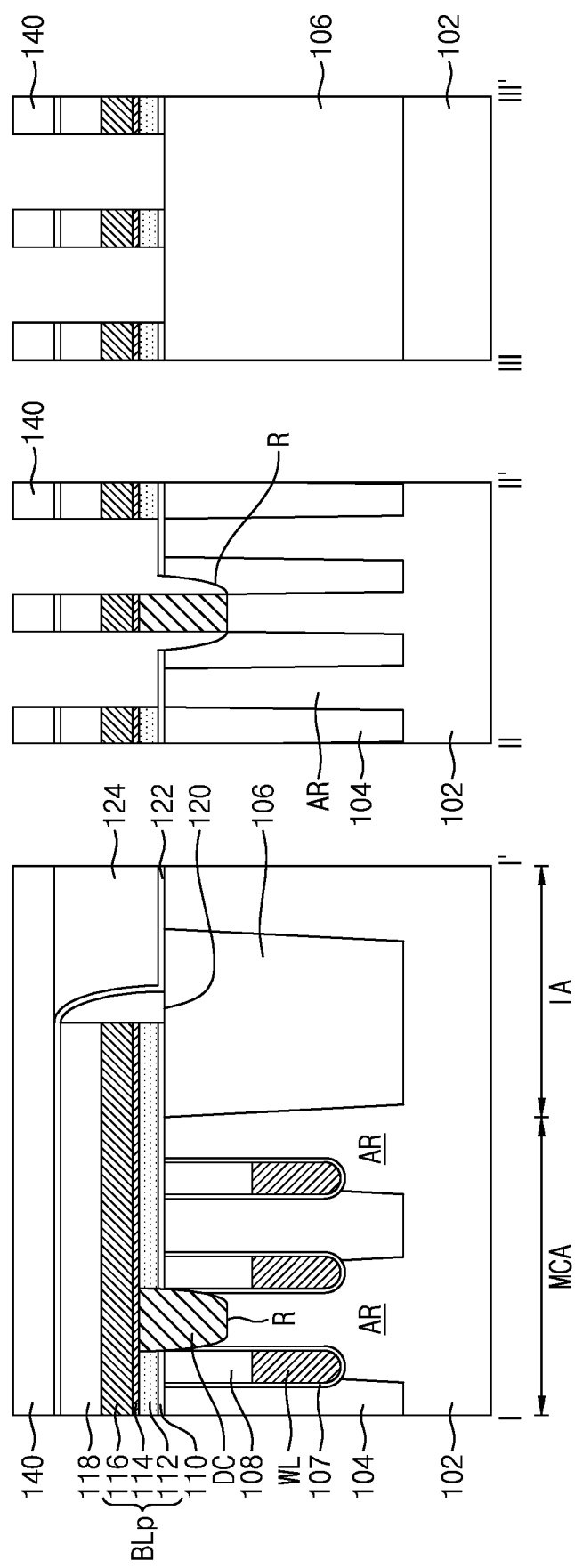

In an exemplary embodiment of the present inventive concept, the edge insulating layer formation process described with reference to FIGS. 11 and 12 may not be performed before the etching process for the bit line material layer BLp described with reference to FIGS. 19 and 20 is performed. FIGS. 23 and 24 show the bit line material layer BLp for which the above-described method is performed. The bit line material layer BLp may not have a separated portion. For example, when viewed in a plan view, the etched bit line material layer BLp may include bar-shaped structures extending in a v direction and a, bar-shaped structure extending in an x direction that is connected to the bar-shaped structures extending in the y-direction.

Figure 25:
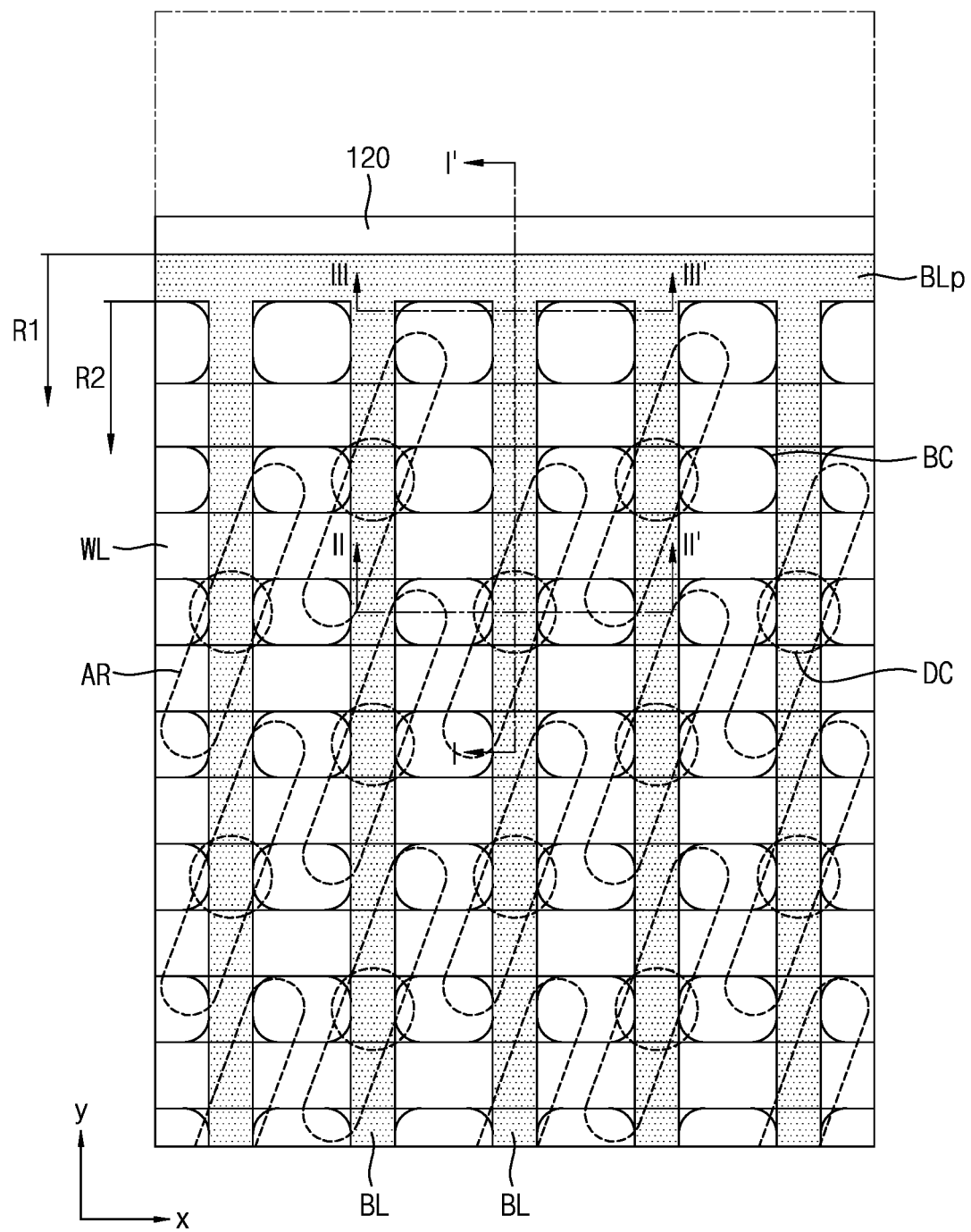
Figure 26:
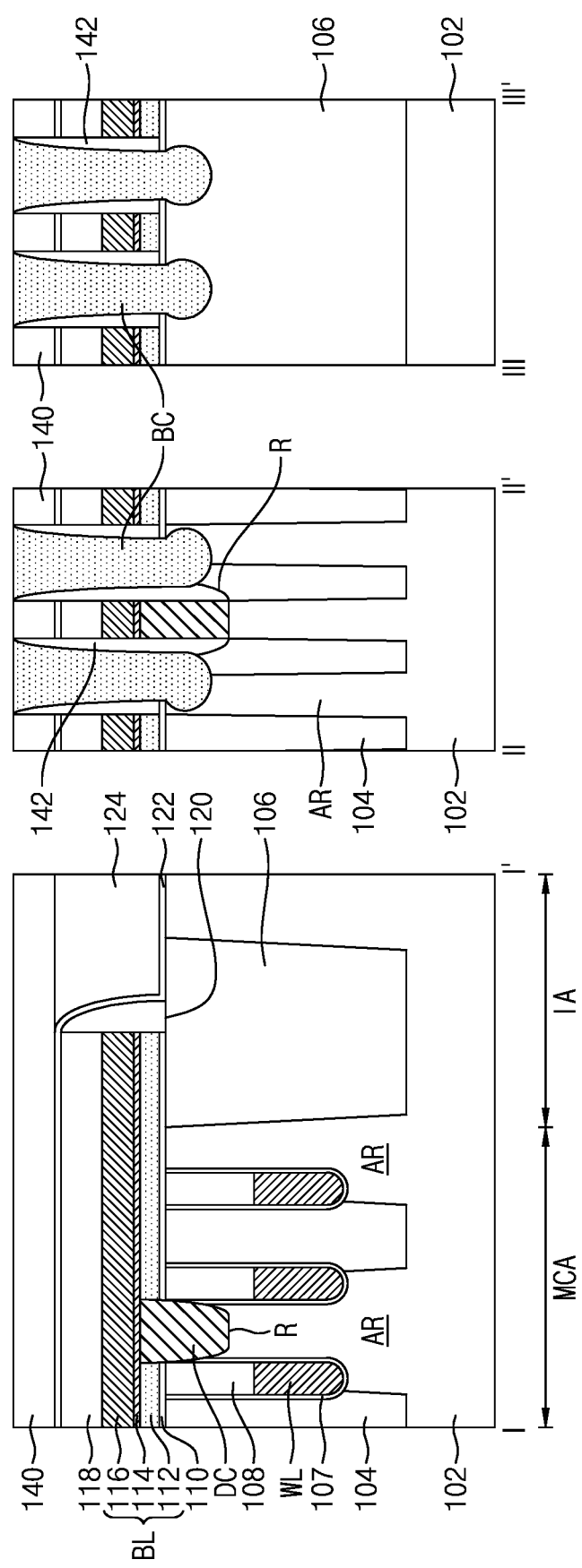

Referring to FIGS. 25 and 26, an insulating spacer 142 may be formed at side surfaces of etched bit line material layers BLp. The insulating spacer 142 may cover a side surface of a direct contact DC. Thereafter, buried contacts BC may be formed among the etched bit line material layers BLp. For example, the buried contacts BC may be disposed among the bit lines BL having the bar-shaped structures extending in the y direction. For example, the buried contacts BC may be disposed between the bit lines BL extending in the y direction. An upper surface of the buried contact BC may be coplanar with an upper surface of the second capping layer 140. In addition, fence insulating layers may be formed to be disposed alternately with the buried contacts BC in the y direction.

Figure 27:
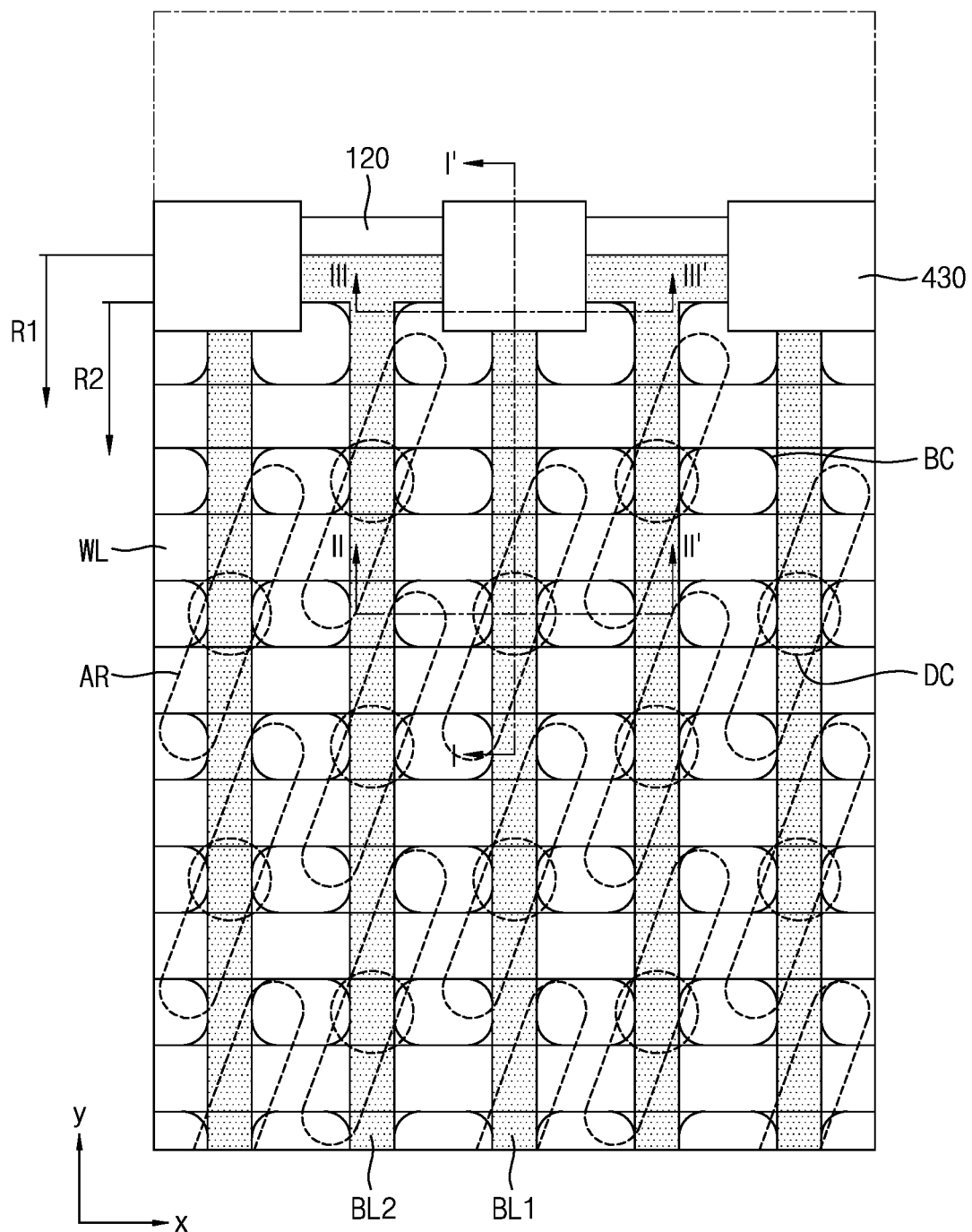
Figure 28:
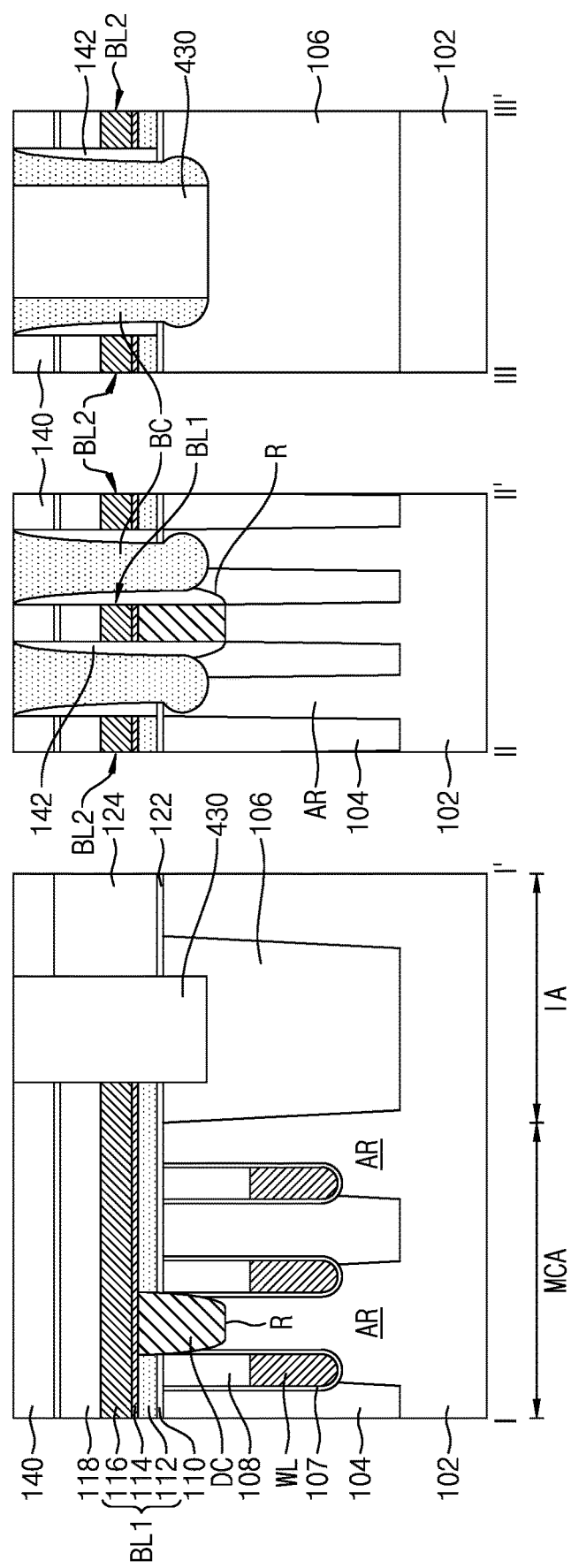

Referring to FIGS. 27 and 28, an edge insulating layer 430 may be formed to extend through the bit line material layer BLp and a portion of the edge spacer 120. Portions of the bit line material layer BLp separated by the edge insulating layer 430 may constitute bit lines, and the bit lines may include a first bit line BL1 and a second bit line BL2.

Upon formation of the edge insulating layer 430, a par of the buried contacts BC may be etched. For example, buried contacts BC disposed at opposite sides of the first bit lines BL1 may be etched. For example, the buried contacts BC, of the plurality of buried contacts BC, nearest to the bit line material layer BLp may be etched. When viewed in a longitudinal sectional view (e.g., a cross sectional view along line III-III'), the edge insulating layer 430 may extend vertically through the buried contacts BC. Although a lower surface of the edge insulating layer 430 is shown as being disposed at the same level as lower ends of the buried contacts BC, the present inventive concept is not limited thereto. In an exemplary embodiment of the present inventive concept, the lower surface of the edge insulating layer 430 may be disposed a level higher or lower than the lower ends of the buried contacts BC. In addition, the edge insulating layer 430 may extend vertically through the second capping layer 140. For example, when viewed in a longitudinal sectional view, a side surface of the edge insulating layer 430 may contact a side surface of the second capping layer 140, and an upper surface of the edge insulating, layer 430 may be coplanar with the upper surface of the second capping layer 140.

Figure 29:
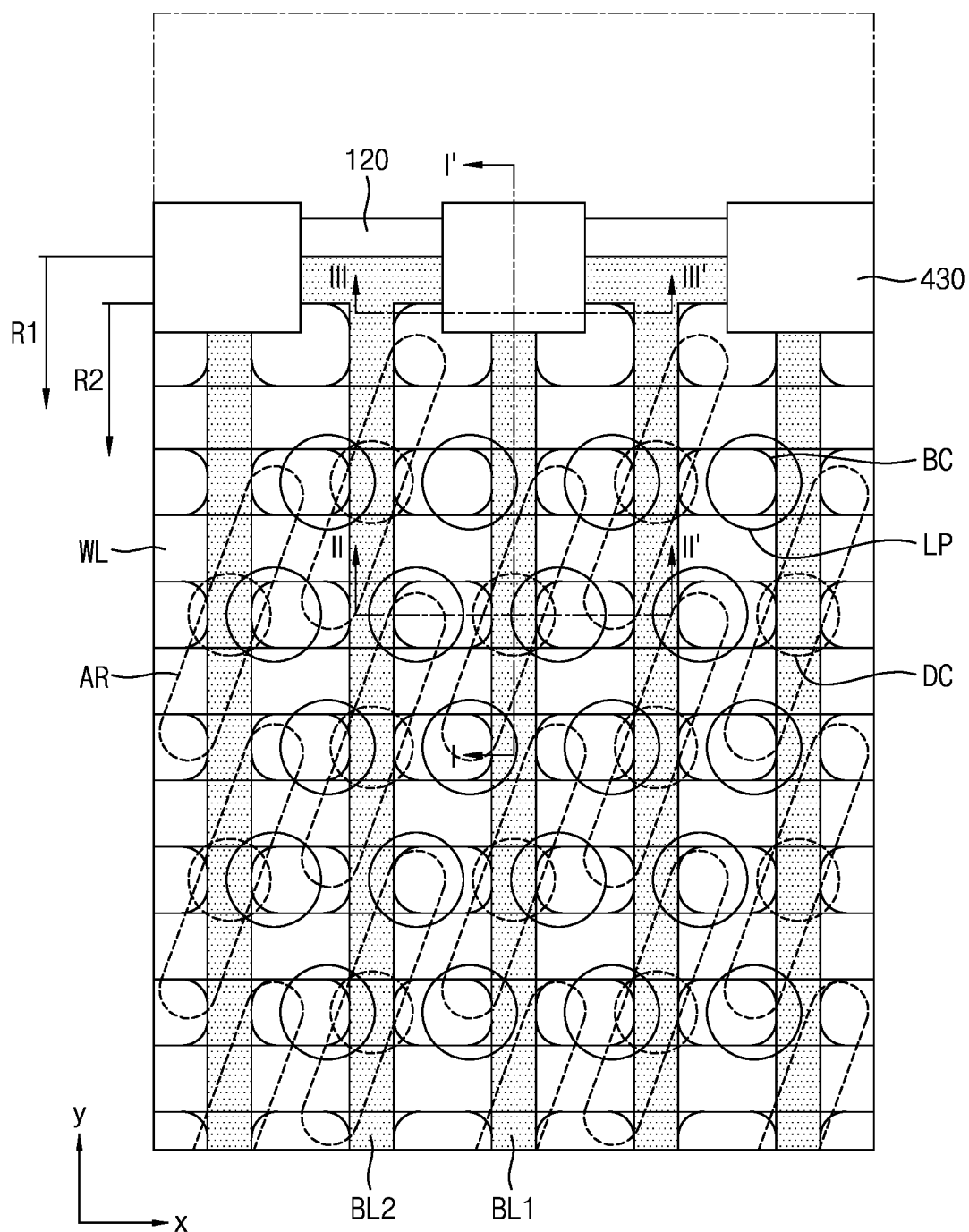
Figure 30:
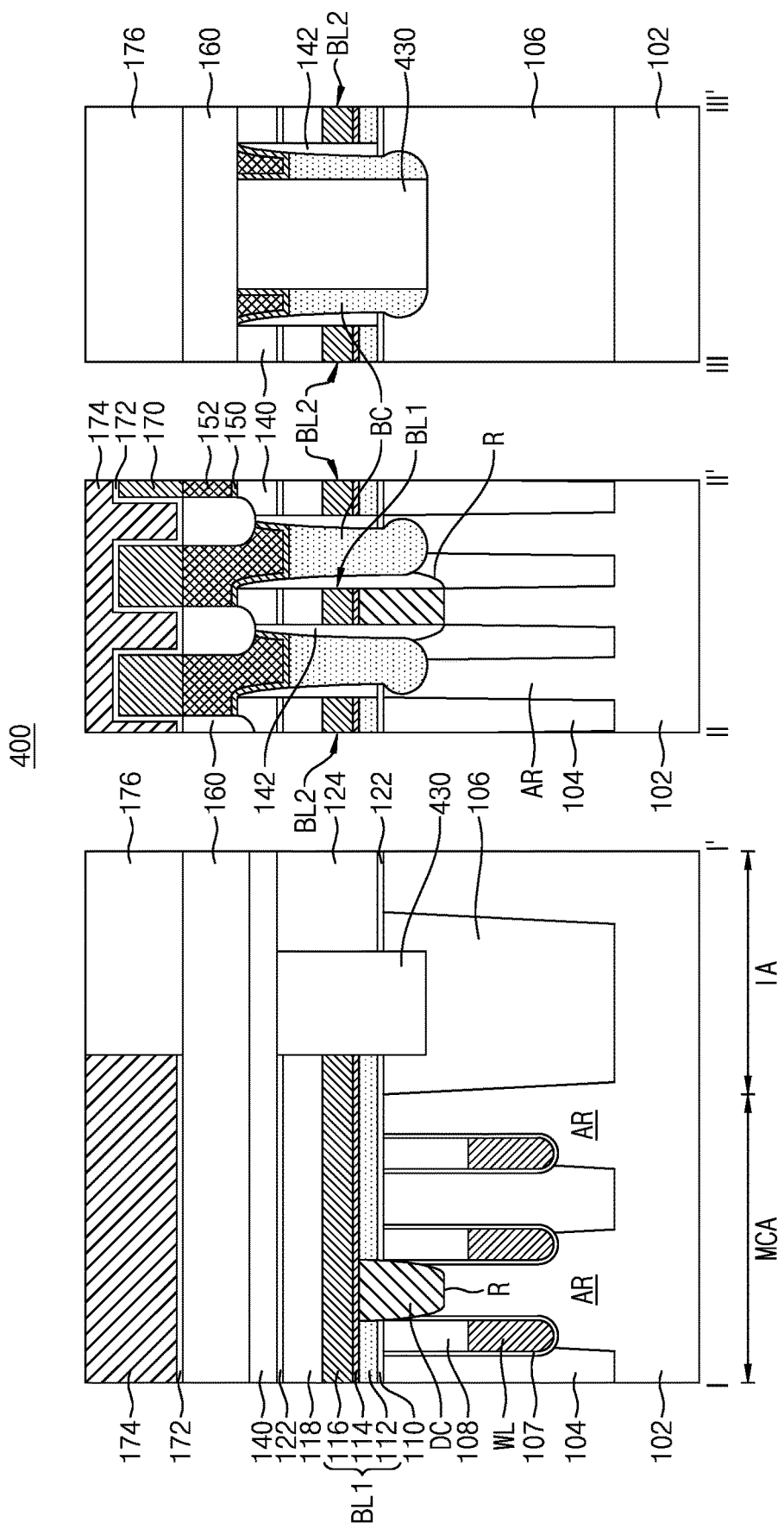

Referring to FIGS. 29 and 30, a barrier layer 150, a landing pad 152 and an insulating structure 160 may be formed. The harrier layer 150 may be conformally formed on the insulating spacer 142 and the buried contact BC. In addition, the barrier layer 150 may partially cover side surfaces of the edge insulating layer 430. The insulating structure 160 may be disposed among landing pads 152. For example, the insulating structure 160 may be disposed between the landing pads 152. The insulating structure 160 may contact the upper surface of the edge insulating layer 430. Thereafter, a lower electrode 170, a capacitor dielectric layer 172, an upper electrode 174, and an upper insulating layer 176 may be formed and, as such, a semiconductor device 400 may be formed.

Figure 31:
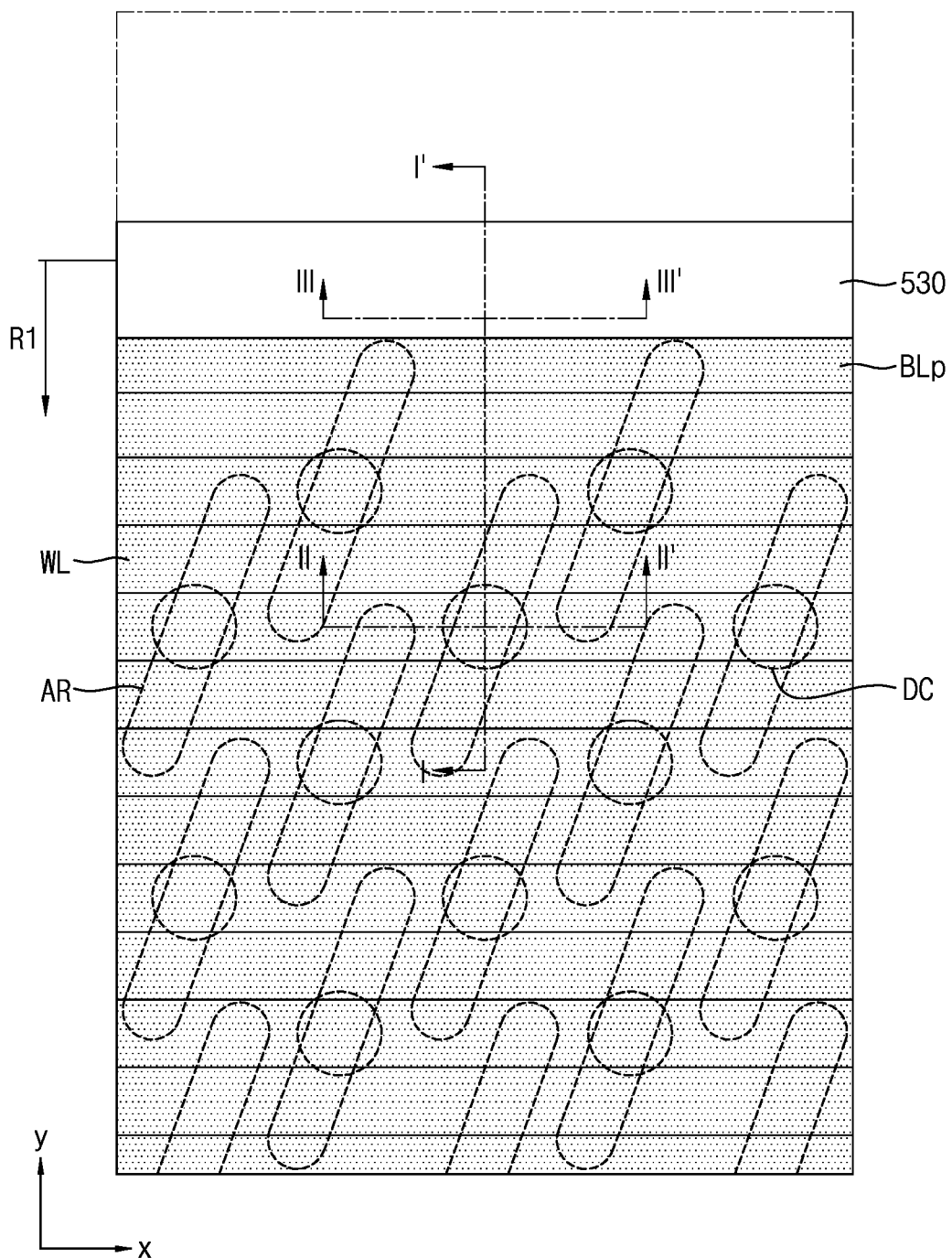
FIGS. 31, 32, 33, 34, 35 and 36 are plan views and cross-sectional views illustrating a process order of a method of manufacturing a semiconductor device according to an exemplary embodiment of the present inventive concept.
Figure 32:
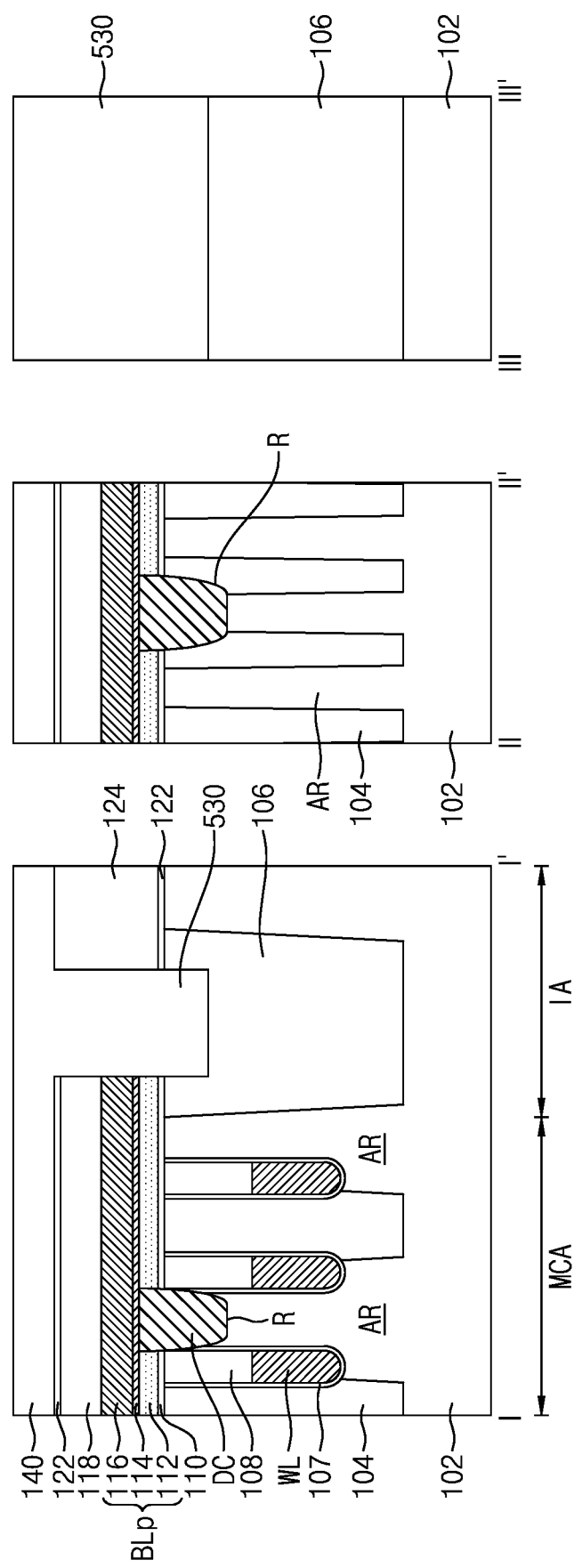
Figure 33:
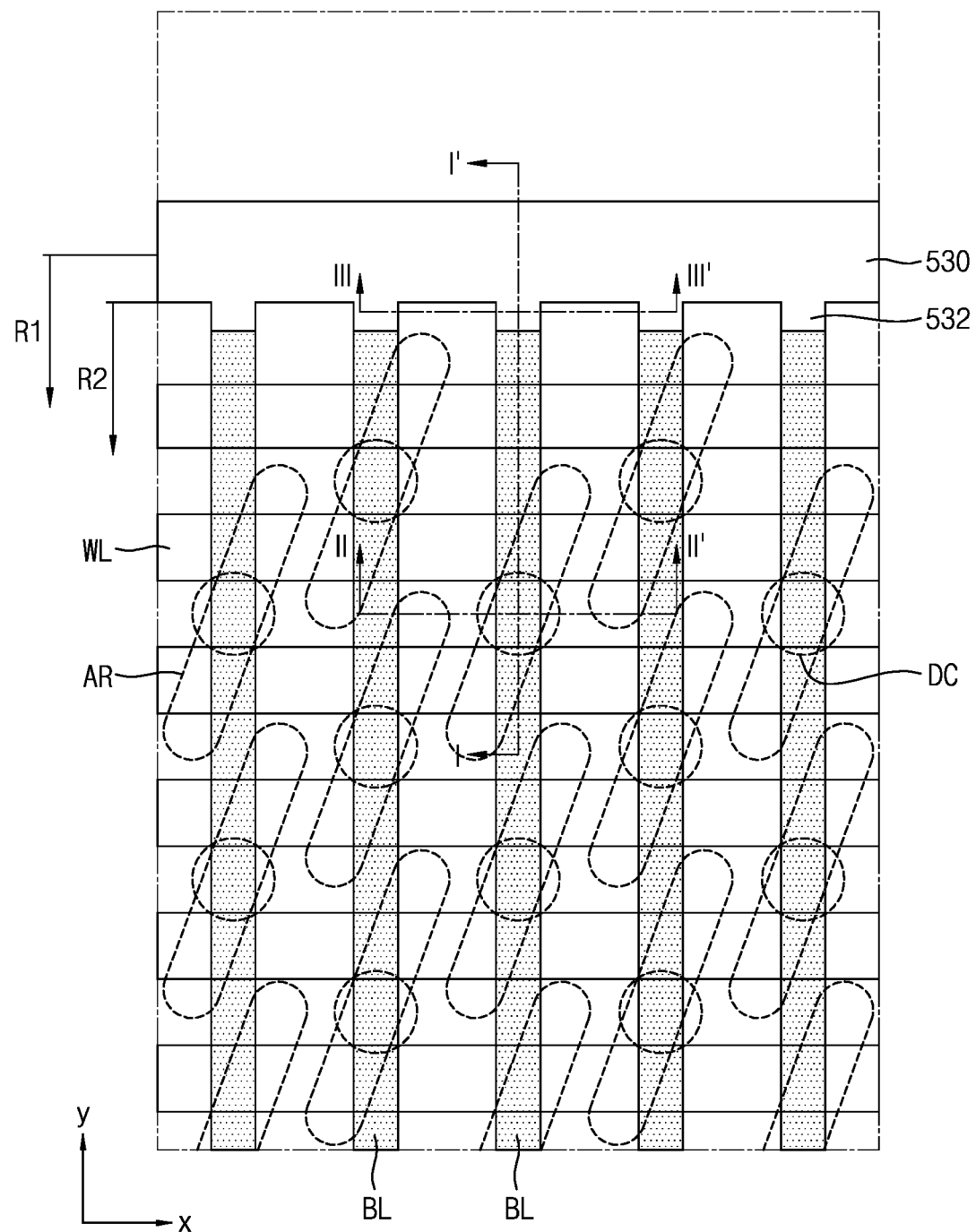
Figure 34:
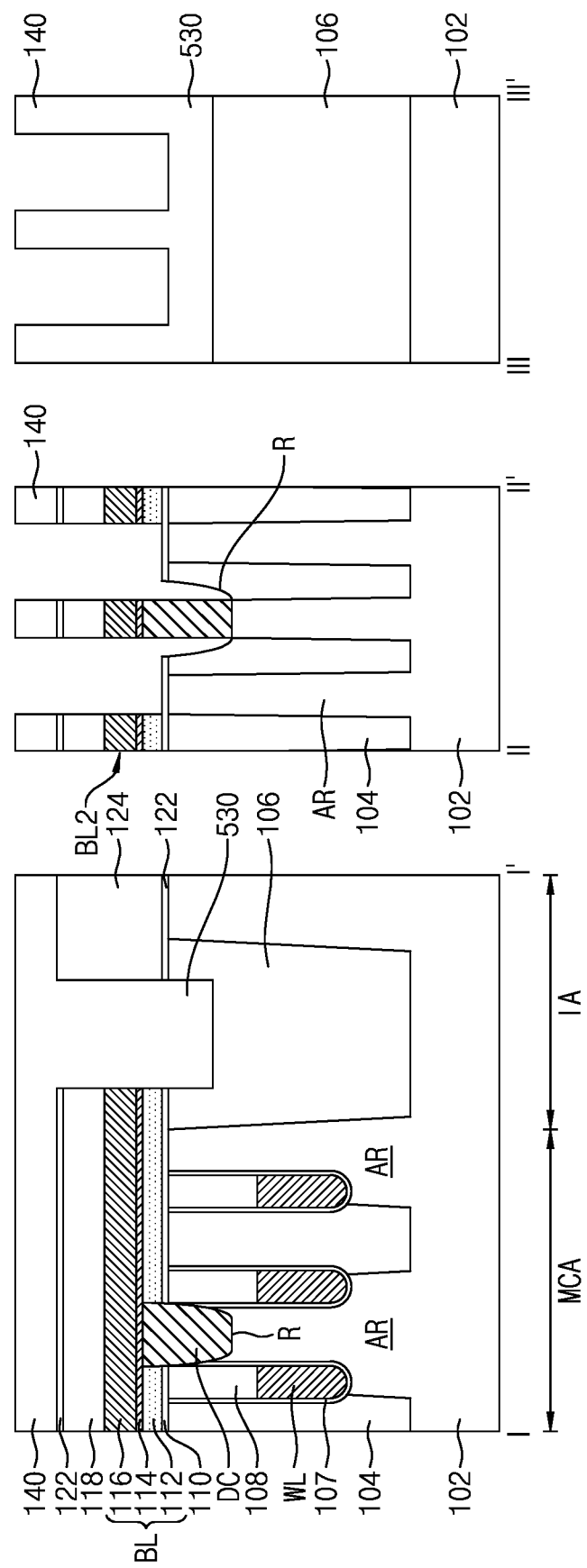
Figure 35:
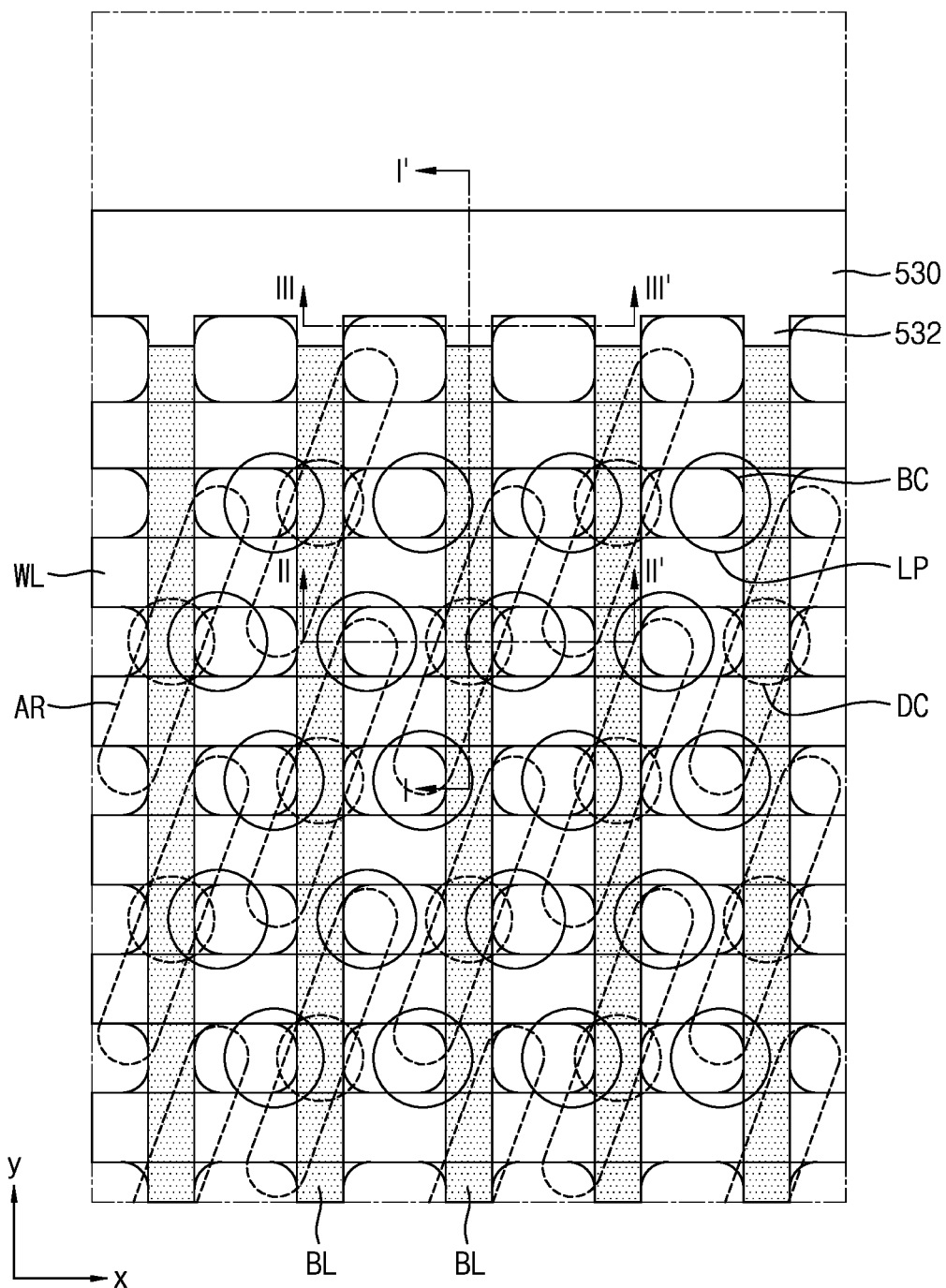
Figure 36:
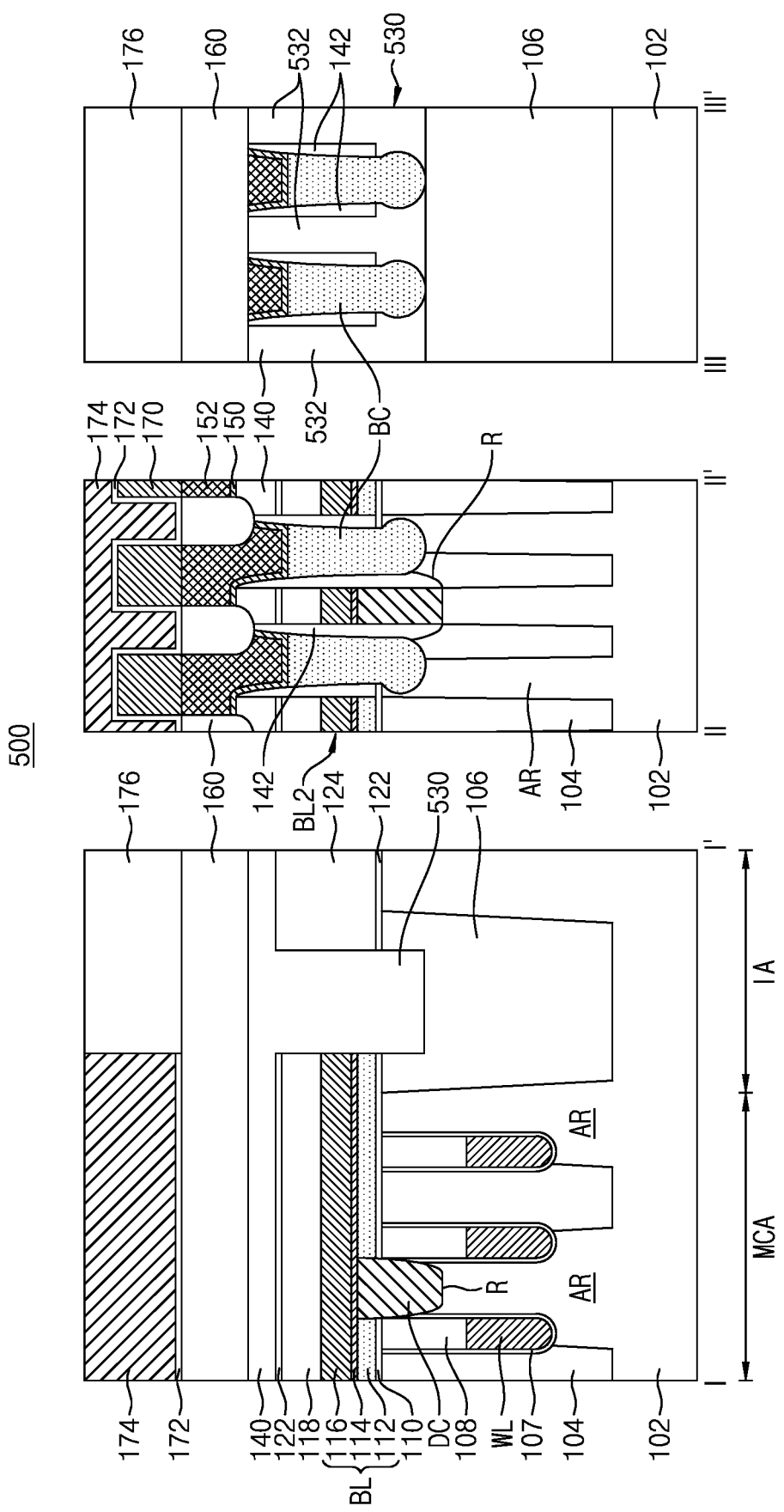

FIGS. 31 to 36 are plan views and cross-sectional views illustrating a process order of a method of manufacturing a semiconductor device according to an exemplary embodiment of the present inventive concept. FIGS. 31, 33 and 35 are plan views. FIGS. 32, 34 and 36 are cross-sectional views taken along lines I-I', II-II' and III-III' in FIGS. 31, 33 and 35, respectively.

Referring to FIGS. 31 and 32, the edge insulating layer formation process described with reference to FIGS. 11 and 12 may be performed. In an exemplary embodiment of the present inventive concept, an edge insulating layer 530 may have a rectangular shape, a bar shape or a line shape having a predetermined width. The edge insulating layer 530 may extend in an x direction, and may contact an end of a bit line material layer BLp. In addition, the edge insulating layer 530 may be disposed under a second capping layer 140, and may be a single continuous body with the second capping layer 140.

Referring to FIGS. 33 and 34, the bit line material layer BLp may be etched, thereby forming bit lines BL. The bit lines BL may have the same shape as one another. Upon formation of the bit lines BL, the edge insulating layer 530 may be partially etched. For example, the edge insulating layer 530 may include protrusions 532 protruding toward the bit lines BL in a y direction, and each protrusion 532 may contact a y-directional end surface of a corresponding one of the bit lines BL. For example, the protrusion 532 may overlap with the bit line BL in the y direction, and the x-directional width of the protrusion 532 may be substantially equal to the x-directional width of the bit line BL. The edge insulating layer 530 may electrically insulate the bit lines BL from one another.

Referring to FIGS. 35 and 36, an insulating spacer 142, a barrier layer 150, a landing pad 152, and an insulating structure 160 may be formed. The insulating spacer 142 may cover side surfaces of the bit lines BL, a direct contact DC and the edge insulating layer 530. The barrier layer 150 may be conformally formed on the insulating spacer 14' and a buried contact BC, and the landing pad 152 may be formed on the barrier layer 150. The insulating structure 160 may be disposed among landing pads 152. Thereafter, a lower electrode 170, a capacitor dielectric layer 172, an upper electrode 174, and an upper insulating layer 176 may be formed and, as such, a semiconductor device 500 may be formed.

Figure 37:
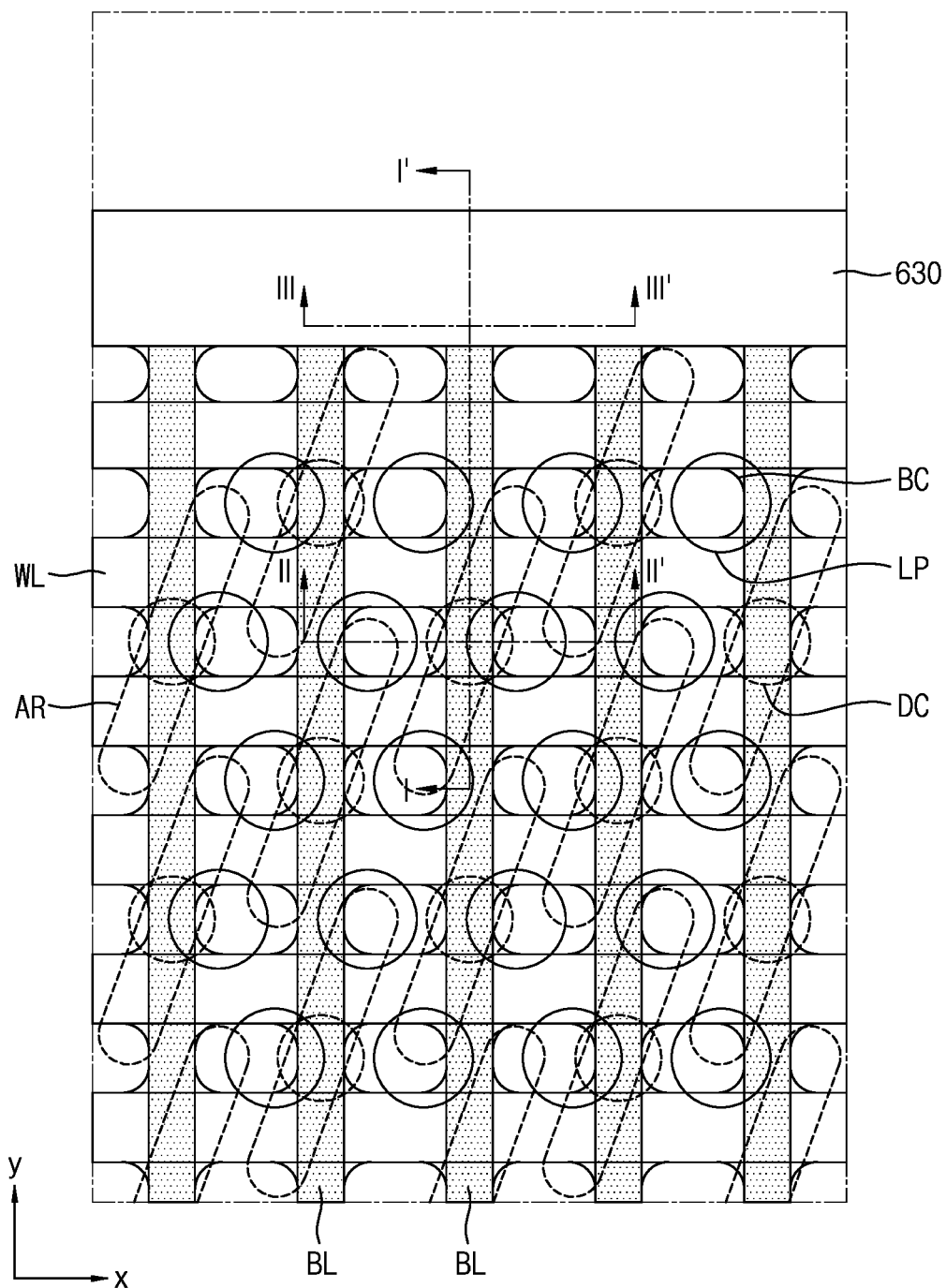
FIG. 37 is a plan view of a semiconductor device according to an exemplary embodiment of the present inventive concept.
Figure 38:
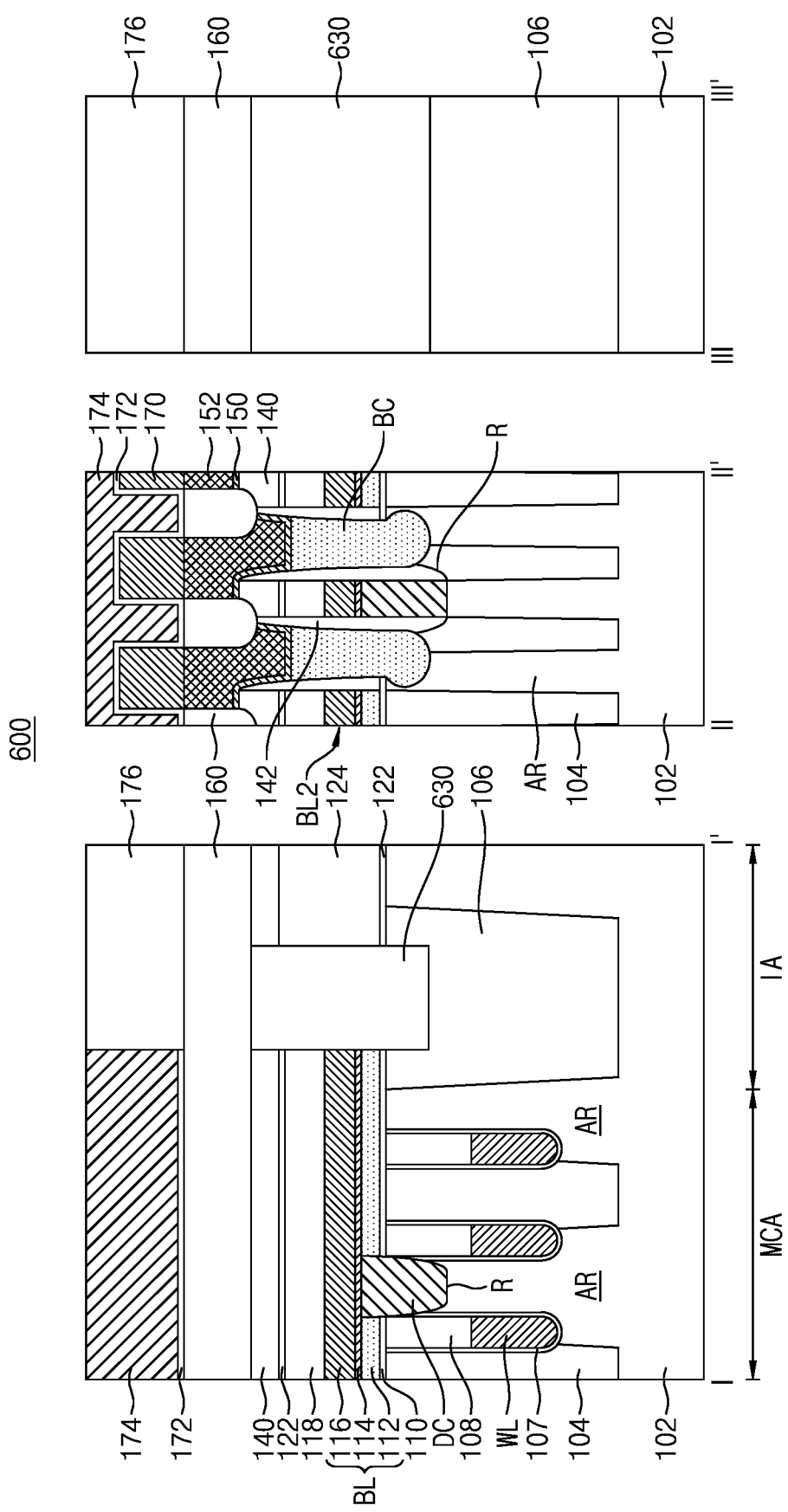
FIG. 38 are cross-sectional views of the semiconductor device taken along lines I-I', II-II' and III-III' in FIG. 37.

FIG. 37 is a plan view of a semiconductor device according to an exemplary embodiment of the present inventive concept. FIG. 38 are cross-sectional views of the semiconductor device taken along lines I-I', II-II' and III-III' in FIG. 37.

In an exemplary embodiment of the present inventive concept, in the edge insulating layer formation process described with reference to FIGS. 27 and 28, an edge insulating layer may be formed to have a bar shape or a line shape. FIGS. 37 and 38 show a semiconductor device 600 including bit lines BL and an edge insulating layer 630 formed through the above-described method. Referring to FIGS. 37 and 38, the edge insulating layer 630 may extend in an x direction, and may contact bit lines BL. When viewed in a plan view, the edge insulating layer 630 may have a substantially uniform y-directional width. In addition, the edge insulating layer 630 may extend vertically through a second capping layer 140. For example, when viewed in a cross sectional view, a side surface of the edge insulating layer 630 may contact a side surface of the second capping layer 140, and an upper surface of the edge insulating layer 630 may be coplanar with an upper surface of the second capping layer 140.

In accordance with the exemplary embodiments of the present inventive concept, upon etching a bit line material layer to form a bit line, an etching process is performed in an area disposed farther inwards of the semiconductor device than a conductive layer separation area in which a bit line material layer is disposed and, as such, collapse of a structure in an interface area may be prevented, and reliability of the resultant device may be increased.

While the present inventive concept has been described with reference to exemplary embodiments thereof, it will be understood by those skilled in the art that various changes in form and details may be made thereto without departing from the spirit and scope of the present inventive concept. Therefore, the above-described exemplary embodiments of the present inventive concept should be considered in a descriptive sense only and not for purposes of limitation.

What is claimed is:

1. A semiconductor device comprising:
   a substrate including a cell area and an interface area;
   a gate electrode disposed in the substrate within the cell area and extending in a first direction;
   a plurality of bit lines intersecting the gate electrode and extending in a second direction intersecting the first direction, wherein the plurality of bit lines includes a plurality of first bit lines and a plurality of second bit lines alternately disposed in the first direction;
   edge spacers disposed within the interface area and contacting the plurality of second bit lines; and
   edge insulating layers disposed between the edge spacers and contacting the plurality of first bit lines,
   wherein at least a portion of each of the edge insulating layers is disposed within the interface area.

2. The semiconductor device of claim 1, wherein each of the plurality of second bit lines includes a tail portion and a head portion, wherein the tail portion extends in the second direction, and the head portion is connected to an end of the tail portion and extends in the first direction.

3. The semiconductor device of claim 2, wherein the head portions contact adjacent edge insulating layers.

4. The semiconductor device of claim 2, wherein a width of the head portion is greater than a width of the tail portion.

5. The semiconductor device of claim 1, wherein the plurality of second bit lines are longer in the second direction than the plurality of first bit lines.

6. The semiconductor device of claim 1, wherein:
   each of the edge insulating layers includes a protrusion protruding toward a corresponding first bit line of the plurality of first bit lines, and
   each of the protrusions contacts an end surface of the corresponding first bit line of the plurality of first bit lines in the second direction.

7. The semiconductor device of claim 6, further comprising:
   insulating spacers covering the plurality of bit lines and side surfaces of the protrusions.

8. The semiconductor device of claim 6, wherein each of the protrusions are aligned with the corresponding first bit line of the plurality of first bit lines in the second direction.

9. The semiconductor device of claim 1, further comprising:
   a capping layer disposed on the plurality of first bit lines,
   wherein the edge insulating layers are a single continuous body with the capping layer.

10. The semiconductor device of claim 1, wherein lower surfaces of the edge insulating layers are disposed at a level lower than that of an upper surface of the substrate.

11. The semiconductor device of claim 1, wherein:
    the edge insulating layers contact adjacent first bit lines of the plurality of the first bit lines and adjacent second bit lies of the plurality of second bit lines, and
    a width of the edge insulating layers in the first direction is equal to a distance between adjacent second bit lines of the plurality of second bit lines.

12. The semiconductor device of claim 1, wherein:
    the edge insulating layers are disposed between adjacent second bit lines of the plurality of second bit lines, respectively, and
    a width of the edge insulating layers in the first direction is equal to a distance between the adjacent second bit lines of the plurality of second bit lines.

13. The semiconductor device of claim 1, further comprising:
an extension extending downwards from a lower surface of each of the edge insulating layers.

14. The semiconductor device of claim 1, further comprising:
a plurality of buried contacts disposed between adjacent first bit lines of the plurality of first hit lines and adjacent second bit lines of the plurality of second bit lines; and
a capping layer disposed on the plurality of first bit lines,
wherein the edge insulating layers extend vertically through adjacent buried contacts of the plurality of buried contacts, respectively,
wherein an upper surface of the edge insulating layers is coplanar with an upper surface of the capping layer.

15. The semiconductor device of claim 14, wherein:
the edge insulating layer includes a plurality of protrusions extending in the second direction toward the plurality of bit lines, and
each of the plurality of bit lines contacts a corresponding protrusion of the plurality of protrusions.

16. The semiconductor device of claim 15, wherein the plurality of protrusions are respectively aligned with the plurality of bit lines in the second direction.

17. A semiconductor device comprising:
a substrate including a cell area and an interface area;
a gate electrode disposed in the substrate within the cell area and extending in a first direction;
a plurality of bit lines intersecting the gate electrode and extending in a second direction intersecting the first direction;
an interlayer insulating layer disposed on the substrate within the interface area; and
an edge insulating layer contacting the plurality of bit lines and extending in the first direction,
wherein at least a portion of the edge insulating layer is disposed within the interface area,
wherein the edge insulating layer is disposed between the plurality of hit lines and the interlayer insulating layer.

18. The semiconductor device of claim 15, wherein a width of the edge insulating layer in the second direction is uniform.

19. A semiconductor device comprising:
a substrate including a cell area and an interface area, wherein the substrate includes active regions disposed within, the cell area;
a gate electrode intersecting the active regions and extending in a first direction;
a plurality of bit lines intersecting the gate electrode and extending in a second direction intersecting the first direction, wherein the plurality of bit lines includes a plurality of first bit lines and a plurality of second bit lines alternately disposed in the first direction;
edge spacers disposed within the interface area and contacting the plurality of second bit lines; and
edge insulating layers disposed between the edge spacers and contacting the plurality of first hit lines, wherein at least a portion of each of the edge insulating layers are disposed within the interface area;
a plurality of buried contacts disposed between adjacent first bit lines of the plurality of first bit lines and adjacent second bit lines of the plurality of second bit lines;
a plurality of landing pads disposed on the plurality of buried contacts and an insulating structure disposed between the landing pads; and
a capacitor structure disposed on the plurality of landing pads and the insulating structure.

20. The semiconductor device of claim 19, wherein:
each of the edge insulating layers includes a protrusion protruding toward a corresponding first bit line of the plurality of first bit lines, and
each of the protrusions contacts an end surface of the corresponding first bit line of the plurality of first bit lines in the second direction.

* * * * *